(12) United States Patent
Koda et al.

(10) Patent No.: US 6,208,945 B1
(45) Date of Patent: Mar. 27, 2001

(54) HARMONIC COMPONENT MEASURING METHOD FOR POWER SYSTEM

(75) Inventors: Isao Koda; Masakazu Tsukamoto; Hideki Fujita; Toshihiro Nakamura, all of Aichi; Shoji Nishimura, Kyoto; Yasuyuki Natsuda, Kyoto; Toshihiko Shikata, Kyoto, all of (JP)

(73) Assignees: Nissin Electric Co., Ltd., Kyoto; Chubu Electric Power Co., Ltd., Nagoya, both of (JP)

( * ) Notice: Subject to any disclaimer, the term of this patent is extended or adjusted under 35 U.S.C. 154(b) by 0 days.

(21) Appl. No.: 09/099,381

(22) Filed: Jun. 18, 1998

(30) Foreign Application Priority Data

Jun. 19, 1997 (JP) .................................................. 9-180570
Jun. 19, 1997 (JP) .................................................. 9-180571
Jun. 19, 1997 (JP) .................................................. 9-180572
Jun. 19, 1997 (JP) .................................................. 9-180573

(51) Int. Cl.$^7$ ............................................... G01R 21/00
(52) U.S. Cl. ......................... 702/60; 702/75; 324/76.19; 324/620; 324/623
(58) Field of Search .................................. 702/60, 75, 76, 702/77, 66; 361/36, 85–87; 318/133; 324/76.19, 620, 622, 623; 700/293

(56) References Cited

U.S. PATENT DOCUMENTS 3,337,772 * 8/1967 Andersson ............................. 361/36
4,477,854 * 10/1984 Usui et al. ............................. 361/36
4,667,152 * 5/1987 Hayes et al. ....................... 324/76.24
5,172,329 * 12/1992 Rahman et al. ...................... 700/293

OTHER PUBLICATIONS

Masahiko Inoue, Denkigakkai ronbunshi B, pub. Aug. 1981, 101(8): 451–458.

* cited by examiner

*Primary Examiner*—Marc S. Hoff
*Assistant Examiner*—Hien Vo
(74) *Attorney, Agent, or Firm*—Finnegan, Henderson, Farabow, Garrett & Dunner, L.L.P.

(57) ABSTRACT

Frequencies fx between the measurement harmonic (mth-degree harmonic) and the (m±1)th-degree harmonics are determined from an expression of $fx=(fs*m)\pm\{(fs/n)*k\}$ where n and k are each an integer. Currents of inter-harmonics of the frequencies fx above and below the measurement harmonic are injected into an inject point in a power system in n cycles of the fundamental wave. Voltage at the inject point based on the injected currents and currents at least either upstream or downstream from the inject point are measured. Admittances for the inter-harmonics above and below the measurement harmonic on at least either the upstream or downstream side from the harmonic inject point are calculated from the measurement results. Interpolation processing based on the calculation results is performed, thereby finding and determining an admittance for the measurement harmonic.

15 Claims, 13 Drawing Sheets

HARMONIC COMPONENT MEASURING METHOD FOR POWER SYSTEM

BACKGROUND OF THE INVENTION

1. Field of the Invention

This invention relates to a harmonic component measuring method for finding an admittance (impedance) and an equivalent circuit for a harmonic (measurement harmonic) in a power system.

2. Description of the Prior Art

To suppress harmonics in a power delivery and distributing system, importance has been attached to decreasing harmonics by a so-called system change technique using harmonic loss. The frequency of a harmonic produced by a system change is an integral multiple of the frequency of the fundamental wave of a system power supply, fs. For example, the frequency of the fifth harmonic, a representative harmonic, is 5*fs. To predict the voltage level of the harmonic, it is necessary to keep track of the harmonic characteristic upstream and downstream from the connection point of the filter in the power system and find its equivalent circuit. The equivalent circuit can be assumed to be a parallel circuit of an admittance element and a current source or a series circuit of an impedance element and a voltage source. The admittance or impedance is the most important to keep track of the harmonic characteristic.

It is described in Denkigakkai ronbunshi B, vol. 101 No. 8, p.451–p.458 (sho 56-8) that to find an equivalent circuit for the fifth harmonic of a power distribution line, the voltage and current of a fundamental wave in the system are measured. From the voltage and current measurements, the admittance (impedance) element and the current source (voltage source) size and phase of the harmonic equivalent circuit are calculated and estimated. However, the equivalent circuit cannot be accurately determined based on the voltage and current measurements of the fundamental wave as described in Denkigakkai.

For example, if an attempt is made to inject (apply) current (voltage) of a frequency which is an integral multiple of the fundamental wave (frequency fs), m*fs (m is an integer of 1, 2, . . . ), into the connection point of the filter and find an equivalent circuit to the harmonic from the measurement results of currents, voltages, etc., points in the system, since the harmonic exists in the power system, change in current, voltage, etc., based on the injected harmonic change cannot clearly be measured and the admittance (impedance) in the power system for the harmonic and an equivalent circuit to the harmonic cannot precisely be found. Therefore, the admittances (impedances) for the harmonics upstream and downstream from the connection point of the filter in the power system and equivalent circuits to the harmonics cannot be found separately with accuracy. Resultantly, a highly accurate prediction of the harmonic voltage level when the system is changed cannot be carried out.

By the way, assuming that the mth-degree harmonic is adopted as a measurement harmonic, currents or voltages of frequencies which are non-integral multiples of the fundamental wave above and below the measurement harmonic do not originally exist in a power system (actual system). Thus, an admittance for the measurement harmonic in the power system and an equivalent circuit to the measurement harmonic can be found from the measurement results based on injecting or applying the currents or voltages as follows:

Currents (voltages) of frequencies which are non-integral multiples of the fundamental wave above and below the measurement harmonic are injected into or applied to the power system and the admittances (impedances) above and below the measurement harmonic in the power system are found from the measurement results.

Interpolation processing such as averaging is applied to the admittances (impedances) above and below the measurement harmonic and the admittance (impedance) in the power system for the resultant intermediate measurement harmonic is found.

Further, when an equivalent circuit is found, a current source (voltage source) for the measurement harmonic in the power system is found from the found admittance (impedance) and the current (voltage) measurement result for the measurement harmonic in the power system and an equivalent circuit made of a parallel circuit of the admittance and the current source or a series circuit of the impedance and the voltage source is found.

In this case, the admittances (impedances) in the power system based on the currents (voltages) of frequencies which are non-integral multiples of the fundamental wave can be found precisely from the measurement results, thus the measurement harmonic admittance (impedance) and equivalent circuit can be found precisely.

However, since voltage or current measurements in the power system based on injecting or applying currents (voltages) of frequencies which are non-integral multiples of the fundamental wave is executed by processing the sampling result by carrying out a frequency analysis such as digital Fourier analysis (DFT), it is not easy to appropriately define the frequencies of the currents (voltages) of frequencies of non-integral multiples of the fundamental wave considering the measurement accuracy requirement, suppression of an analysis error caused by so-called sampling edges, and the like.

Particularly, to adopt a plurality of currents (voltages) of frequencies which are non-integral multiples of the fundamental wave each above and below the measurement harmonic and find the admittances (impedances) each above and below the measurement harmonic more accurately from measurement result averages, etc., it is extremely difficult to determine the frequency of the current (voltage) of the frequency of each non-integral multiple of the fundamental wave.

The analysis error caused by sampling edges is a frequency analysis error caused by discontinuity between the start and end of sampling. If the sampling frequency is made sufficiently higher than the fundamental wave frequency to prevent the error, a measuring apparatus becomes expensive and complicated.

Currents or voltages of frequencies which are non-integral multiples of the fundamental wave above and below the measurement harmonic may exist in an actual power system and the frequencies and magnitudes vary depending on the system, time period, etc.

If a current or voltage source has the same frequency as the current injected into or voltage applied to the power system, the measurement harmonic admittance (impedance) and the equivalent circuit cannot be found precisely. It is desirable to adopt a plurality of injected currents (applied voltages) of frequencies which are non-integral multiples of the fundamental wave each above and below the measurement harmonic and find an equivalent admittance (impedance) and an equivalent circuit to the measurement harmonic with the effect of the current source (voltage source) existing in the power system excluded as much as possible from an average of measurement results, etc., based on the injected currents (applied voltages).

However, if injected currents (applied voltages) of frequencies each above and below the measurement harmonic are injected (applied) one at a time and measurement is repeated, rapid measurement cannot be executed in a short time and moreover an error based on a measurement time lag easily occurs; an equivalent admittance (impedance) or an equivalent circuit cannot be found rapidly with accuracy.

If the frequencies of the injected currents (applied voltages) are only set, for example, in order starting at the frequency close to the measurement frequency, the effect of the current (voltage) existing in the power system cannot be minimized for measurement and highly accurate measurement with less injected current (applied voltage) cannot be accomplished.

Because of a restriction from the viewpoint of the power capacity, etc., of a unit for forming the injected currents (applied voltages), as the number of injected currents (applied voltages) is increased, the injected current amount (applied voltage) of each frequency decreases (lowers); particularly with a small unit of a small power capacity, when the harmonic in the power system is comparatively large, shortage of the injected current amount (applied voltage) occurs and measurement cannot be carried out depending on the number of injected currents, etc.

From the aspect of measurement accuracy, etc., it is desirable to increase the inject amount of the current of a frequency which is a non-integral multiple of the fundamental wave, but the load condition on the power system varies depending on the system, time period, etc., and it is extremely difficult to set the inject amount appropriately.

If a constant amount of current properly set is only injected into the power system for measurement, the degree of voltage distortion relative to the injected frequency into the power system changes with change in the load condition, thus shortage of the injected current amount occurs in some cases and measurement cannot be accomplished with intended accuracy.

Further, if the injected frequency matches or is close to a resonance point in the power system, the distortion voltage in the power system based on frequency injecting is enlarged remarkably due to resonance, thus it is feared that an excessive distortion voltage of a frequency which is a non-integral multiple of the fundamental wave may occur in the power system, adversely affecting load on the power system.

Since the load condition on the power system varies from moment to moment and is unknown and it is impossible to keep track of resonance frequency, it is impossible to inject an optimum amount of a current of a frequency which is a non integral multiple of the fundamental wave not adversely affecting the load on the power system and to precisely find the admittance or the equivalent circuit to the measurement harmonic from the measurement result.

SUMMARY OF THE INVENTION

Generally, the present invention provides a harmonic component measuring method for a power system, for finding an admittance (impedance) for a measurement harmonic or an equivalent circuit including the admittance (impedance) and a current source in parallel (series), wherein an mth-degree harmonic of a frequency which is m times (m is an integer) a frequency fs of a fundamental wave in the power system is used as the measurement harmonic. The harmonic component measuring method includes the steps of: (1) synchronizing currents (voltages) of inter-harmonics with the measurement harmonic, wherein the currents (voltages) of inter-harmonics comprises currents (voltages) of frequencies fx which are non-integral multiples of the fundamental wave above and below the measurement harmonic; (2) finding and determining the frequencies fx of the currents (voltages) of inter-harmonics between the mth-degree measurement harmonic [(mth-degree harmonic)] and (m±1)th-degree harmonics from an expression of fx=(fs*m)±{(fs/n)*k)} where n is an integer of 1, 2, . . . , n responsive to measurement accuracy 1/n (0<1/n<1) and k is an integer of 1, 2, . . . , n for frequency setting; (3) injecting the currents (voltages) of inter-harmonics into a harmonic inject point in the power system in n cycles of the fundamental wave; (4) measuring voltages at the harmonic inject point based on the injected (applied) currents (voltages) of inter-harmonics and measuring currents at least either upstream or downstream from the harmonic inject point in the power system; (5) calculating admittances (impedances) for the injected (applied) currents (voltages) of inter-harmonics on at least either an upstream or a downstream side from the harmonic inject point from the measurement results; and (6) performing interpolation processing based on the calculation results to find the admittance (impedance) for the measurement harmonic on at least either the upstream or the downstream side from the harmonic inject point.

In the harmonic component measuring method as described above, the injected (applied) currents (voltages) of frequencies of non-integral multiples of the fundamental wave above and below the measurement harmonic are found as currents (voltages) of inter-harmonics synchronized with the fundamental wave by calculation of a simple expression considering measurement accuracy. Since the current (voltage) of the intermediate-degree harmonic is injected (applied) over n cycles of the fundamental wave, the period of injecting the current (voltage) of the intermediate-degree harmonic always becomes integer cycles (m*n±k). If current (voltage) in the power system based on injecting (applying) of current (voltage) of intermediate-degree harmonic in integer cycles is measured and current (voltage) of intermediate-degree harmonic in integer cycles in the power system is sampled for carrying out a frequency analysis, etc., thereon, a frequency analysis error, etc., caused by sampling edges is prevented without making extremely high sampling frequencies because of sampling synchronized with the fundamental wave and the admittances (impedances) for the inter-harmonics above and below the measurement harmonic are found with desired measurement accuracy. An equivalent circuit is also found from the result.

The present invention also provides a harmonic component measuring method for a power system, for finding an admittance (impedance) for a measurement harmonic or an equivalent circuit including the admittance (impedance) and a current source in parallel (series) wherein an nth-degree harmonic of a frequency which is n times (n is an integer) a frequency fs of a fundamental wave in the power system is used as the measurement harmonic. The harmonic component measuring method includes the steps of: (1) performing a frequency analysis of system voltage data at a harmonic inject point in the power system and detecting (n±m) th-degree (0<m<1) intermediate-degree harmonic components in an order starting at the component closest to the measurement harmonic, wherein the (n±m) th-degree intermediate-degree harmonic components are components of frequencies of non-integral multiples of the fundamental wave, synchronized therewith, above and below the measurement harmonic of the system voltage; (2) determining inject (apply) frequencies above and below the measurement harmonic at a measurement time, wherein the inject (apply)

frequencies above and below the measurement harmonic comprises first detected frequencies of the intermediate-degree harmonic components above and below the measurement harmonic at which the harmonic components are equal to or less than a setup value; (3) injecting (applying) currents (voltages) of the inject (apply) frequencies into the harmonic inject point at the measurement time; (4) measuring voltages at the harmonic inject point based on the injected (applied) currents (voltages) of the inject (apply) frequencies and measuring currents at least either upstream or downstream from the harmonic inject point in the power system; (5) calculating admittances (impedances) for the injected (applied) currents (voltages) of the inject (apply) frequencies on at least either an upstream or a downstream side from the harmonic inject point from the measurement results; and (6) performing interpolation processing based on the calculation results to find the admittance (impedance) for the measurement harmonic on at least either the upstream or the downstream side from the harmonic inject point.

In the harmonic component measuring method as described above, a frequency analysis of the system voltage at the harmonic inject point in the power system is carried out. Detected from the analysis result are frequency components of non-integral multiples of the fundamental wave synchronized therewith, of magnitudes equal to or less than the setup up value closest to the measurement harmonic above and below the measurement harmonic in the system voltage. The frequencies are inject (apply) frequencies of injected (applied) currents (voltages) above and below the measurement harmonic.

The injected (applied) currents (voltages) of the inter-harmonics of the inject (apply) frequencies above and below the measurement harmonic are injected (applied) into (to) the harmonic inject point in the power system and the admittances (impedances) for the inter-harmonics of the injected (applied) currents (voltages) are found from the current (voltage) measurement result in the power system based on injecting (applying) the currents (voltages). Then the admittance (impedance) for the measurement harmonic is found and determined from an intermediate value of the admittances (impedances).

The injected (applied) currents (voltages) above and below the measurement harmonic are set to currents (voltages) of the inter-harmonics with extremely small effect of the power system and closest to the measurement harmonic not present in the power system or of magnitudes equal to or less than the setup value if present based on the actual measurement result. Thus, the admittance (impedance) for the measurement harmonic in the power system is found reliably with accuracy by injecting (applying) current (voltage) of a small capacity and can be used to find an equivalent circuit precisely.

According to another aspect of the present invention, there is provided a harmonic component measuring method for a power system including the steps of: (1) injecting currents of frequencies of non-integral multiples of a fundamental wave above and below a measurement harmonic into a harmonic inject point in the power system while gradually increasing the currents until a distortion voltage measured at the harmonic inject point rises to almost a predetermined upper limit voltage, wherein the measurement harmonic is a harmonic of a frequency of an integral multiple of the fundamental wave; (2) calculating admittances for the injected currents on at least either an upstream or a downstream side from the harmonic inject point in the power system from voltage measurement results at the harmonic inject point based on the injected currents and current measurement results on at least either the upstream or the downstream side from the harmonic inject point in the power system; (3) performing interpolation processing based on the calculation results to find an admittance for the measurement harmonic on at least either the upstream or the downstream side from the harmonic inject point; (4) finding and determining a current source of the equivalent circuit for the measurement harmonic on at least either the upstream or downstream side from the harmonic inject point from the admittance determined for the measurement harmonic and measurement harmonic voltage and current measurement results in the power system at the harmonic inject point; and (5) finding the equivalent circuit for the measurement harmonic on at least either the upstream or the downstream side from the harmonic inject point from a parallel circuit of the determined admittance and the determined current source.

In the harmonic component measuring method described above, based on repeating the step of injecting the currents of the frequencies of non-integral multiples of the fundamental wave above and below the measurement harmonic into a harmonic inject point in the power system while gradually increasing the currents and the step of measuring distortion voltage of inject frequencies, each current is previously set to the current amount immediately preceding the current amount causing excessive distortion voltage in the power system, namely, the optimum current amount not adversely affecting the load on the power system although current is injected.

As the optimum inject amounts of currents are injected, the admittances in the power system for the injected currents of the frequencies of non-integral multiples of the fundamental wave above and below the measurement harmonic are found accurately without adversely affecting the load on the power system and the admittance and equivalent circuit for the measurement harmonic is found precisely from the result.

According to still another aspect of the present invention, there is provided a harmonic component measuring method for a power system, for finding an admittance for a measurement harmonic or an equivalent circuit including the admittance and a current source in parallel, wherein an nth-degree harmonic of a frequency which is n times (n is an integer) a frequency fs of a fundamental wave in a power system is used as the measurement harmonic. The harmonic component measuring method including the steps of: (1) simultaneously injecting currents of frequencies of non-integral multiples of the fundamental wave above and below the measurement harmonic into a harmonic inject point in the power system; (2) measuring voltages at the harmonic inject point based on the injected currents and measuring currents at least either upstream or downstream from the harmonic inject point in the power system; (3) calculating admittances for the injected currents on at least either an upstream or a downstream side from the harmonic inject point in the power system from the measurement results; and (4) performing interpolation processing based on the calculation results to find the admittance for the measurement harmonic on at least either the upstream or downstream side from the harmonic inject point.

In the harmonic component measuring method described above, the currents of the frequencies of non-integral multiples of the fundamental wave above and below the measurement harmonic are simultaneously supplied to the power system and are measured. In this case, each current can be injected and measured in a short time independently of the number of injected currents and a measurement error involved in injecting and measurement time lag does not occur. The admittance for the measurement harmonic or equivalent circuit is found rapidly with accuracy.

The present invention further provides a harmonic component measuring method including the steps of: (1) limiting the number of injected currents when the measured voltage of each of the frequencies of non-integral multiples of the fundamental wave at the harmonic inject point based on injecting of the currents of the frequencies of non-integral multiples of the fundamental wave above and below the measurement harmonic becomes equal to or less than a reference value, and again injecting one or more currents of the frequencies of non-integral multiples of the fundamental wave above and below the measurement harmonic into the harmonic inject point; (2) calculating admittances based on the currents of the frequencies of non-integral multiples of the fundamental wave above and below the measurement harmonic from the voltage measurement results at the harmonic inject point wherein the voltage measurement result is based on again injecting of the current or currents and the current measurement result on at least either the upstream or the downstream side from the harmonic inject point; and finding the admittance for the measurement harmonic on at least either the upstream or downstream side from the harmonic inject point.

Therefore, in the harmonic component measuring method described above, when the amount of each of the currents of the frequencies of non-integral multiples of the fundamental wave is insufficient because of limitation of the power capacity of the apparatus, etc., the number of injected currents is lessened and then the currents of the frequencies of non-integral multiples of the fundamental wave are again injected into the power system. At this time, each injected current amount increases as compared with that at the first injecting time and measurement can be executed based on sufficient amounts of injected currents; a small apparatus with a small power capacity can be used to execute highly accurate measurement.

It is an object of the invention to find and determine the frequencies of the currents (voltages) of frequencies of non-integral multiples of the fundamental wave from a simple calculation expression considering measurement accuracy, etc., and enable the currents (voltages) of the determined frequencies to be injected into (applied to) the power system while preventing a frequency analysis error, etc., at the measurement time.

It is another object of the invention to provide a new measuring method capable of injecting currents (applying voltages) of frequencies which are non-integral multiples of a fundamental wave less affected by a power system above and below a measurement harmonic into (to) the power system and finding equivalent circuits, etc., precisely.

It is still another object of the invention to set the amounts of injecting currents of frequencies which are non-integral multiples of a fundamental wave above and below a measurement harmonic to optimum amounts not adversely affecting load on a power system and precisely find the admittance and the equivalent circuit for the measurement harmonic from the results of injecting the optimum amounts of currents.

It is another object of the invention to inject (apply) currents (voltages) of frequencies which are non-integral multiples of a fundamental wave above and below a measurement harmonic into a power system in a short time, measure the currents (voltages), prevent an error caused by a current injecting (voltage applying) time lag, and to find the admittance (impedance) or the equivalent circuit for the measurement harmonic in the power system rapidly with accuracy.

It is still another object of the invention to enable highly accurate measurement in a small amount of an injected current (applied voltage) for miniaturizing a measuring apparatus, etc.

It is another object of the invention to prevent shortage of an injected current (applied voltage) for enabling precise measurement independently of restriction on the power capacity of a measuring apparatus.

DESCRIPTION OF THE PREFERRED EMBODIMENT(S)

A first embodiment of the invention will be discussed with reference to FIG. 1 and FIG. 2.

Figure 1:
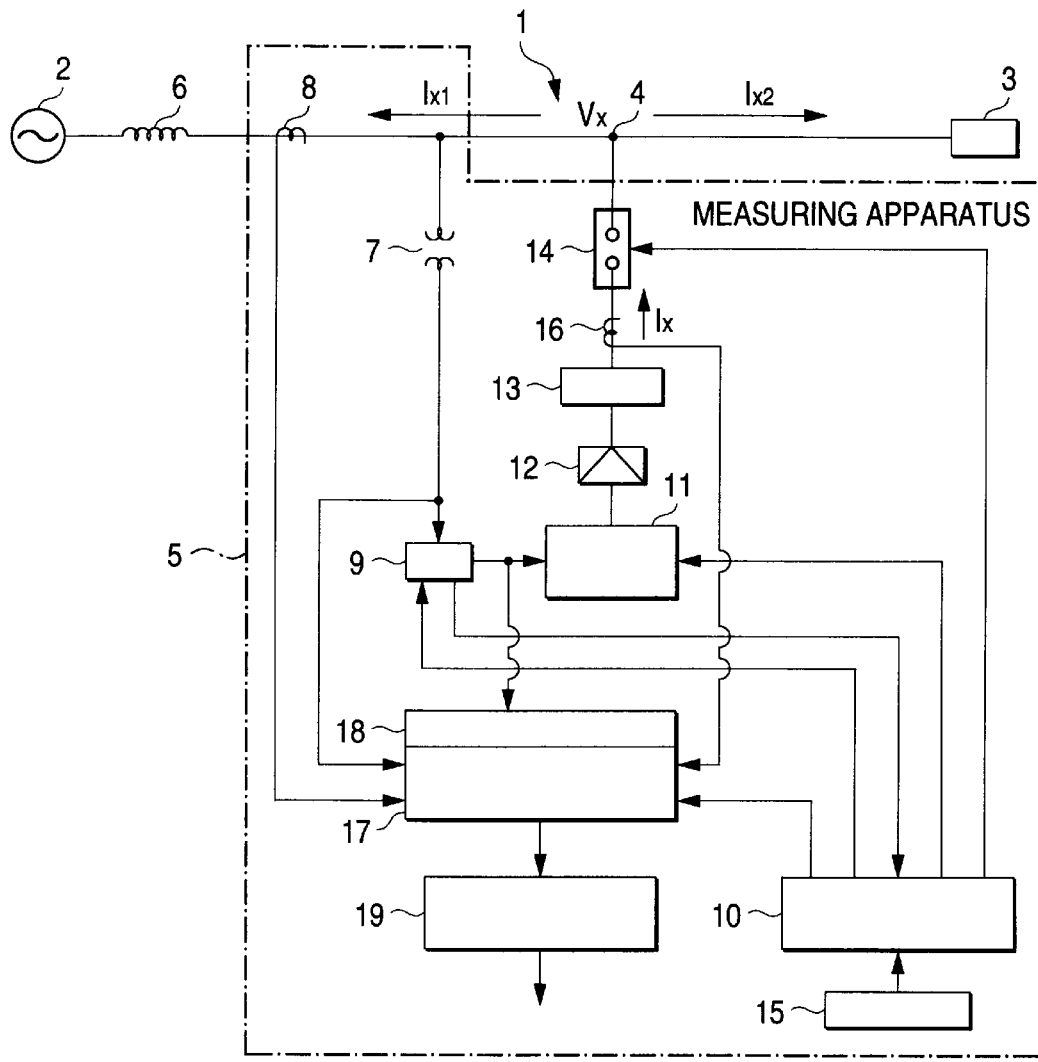
FIG. 1 is a circuit block diagram of a first embodiment of the invention.

To measure harmonics in a power system, as shown in FIG. 1, current (voltage) is injected into (applied to) a harmonic inject point 4 from a measuring apparatus 5. The harmonic inject point 4 is located at a proper position between a system power supply 2 and a load 3 in a power system 1, for example, a position where a filter for decreasing harmonic current is connected.

In addition to a fundamental wave of frequency fs, there exist in the power system 1 harmonics of frequencies n*fs which are integral multiples of the fundamental wave. The load 3 is connected downstream (load side) of the system 1 viewed from the harmonic inject point 4 relative to the harmonics. The system power supply 2 is connected upstream (power supply side), for example, via a line impedance 6.

The harmonic equivalent circuits upstream and downstream of the system represented by the Norton theorem can each be assumed to be a parallel circuit of an admittance element and a current source.

The downstream current source does not actually exist and is formed equivalently due to current distortion, etc., caused by the load.

The upstream line impedance 6 is known based on the line characteristic of the power system 1.

When the mth-degree harmonic, such as the fifth harmonic (m=5), is used as a measurement harmonic and the ever-changing admittances (time constants) upstream and downstream from the harmonic inject point 4 for the measurement harmonic are found, the voltage (system voltage) at the harmonic inject point 4 is measured with a transformer 7. The currents at least either upstream or downstream from the harmonic inject point 4, are also measured. For example, the upstream currents are measured with a current transformer 8.

Further, a detected voltage signal of the transformer 7 is supplied to a synchronizing signal generation section 9 of a PLL circuit configuration, which then forms a synchronization control signal of a frequency (fx) which is a non-integral multiple of the fundamental wave and synchronized with the 60-Hz fundamental wave, for example, of the system power supply 2 based on a control signal of a control section 10.

An inject source signal generation section 11 generates a signal of frequency fx synchronized with the fundamental wave as an inject signal of an intermediate-degree harmonic based on the synchronization control signal. The inject signal is amplified by an amplifier 12 to form a current of the intermediate-degree harmonic of frequency fx. The current is injected into the harmonic inject point 4 via an inject circuit 13 and a switch 14.

The control section 10 sets the frequency fx for the intermediate-degree harmonic current as follows:

Assuming that the measurement harmonic is the mth-degree harmonic and that the measurement accuracy is 1/n (where n is an integer 1, 2, . . . satisfying 0<1/n<1), the control section 10 finds and determines the frequency fx of each intermediate-degree harmonic between the mth-degree measurement harmonic and the (m±1)th-order harmonics above and below the mth-degree measurement harmonic from calculation of the following expression in Expression 1:

$$fx=(fs*m)\pm\{(fs/n)*k\} \qquad \text{[Expression 1]}$$

Where k is an integer of 1, 2, . . . , n for frequency setting. When k=1, 2, . . . , n−1, the intermediate-degree harmonic frequencies at fs/n intervals are found from Expression 1. When k=n, fx=fs*(m±1) and the frequencies in Expression 1 equal the frequencies of the (m±1)-degree harmonics above and below the measurement harmonic.

If k=0, then fx=fs*m and the frequency equals the frequency of the measurement harmonic (mth-order harmonic).

The values of fs, m, n, and k in Expression 1 are given to the control section 10 through a keyboard operation in an operation section 15. To use the fifth harmonic (5-order harmonic) in a 60-Hz power system as a measurement harmonic and find the admittance thereof with 1/10 measurement accuracy, the following parameters are given to the control section 10 from the operation section 15: fs=60 (Hz), m=5, n=10, and k=1, 2, . . . , 10.

In this case, when k=1, fx=300±6 Hz; when k=2, fx=300±12 Hz; when k=3, fx=300±13 Hz; . . . ; when k=10, fx=300±60 Hz. Intermediate-degree harmonic frequencies fx at 6-Hz intervals are found by dividing the frequency zone between the fifth harmonic (300 Hz) and the 6-order harmonic(300+60 Hz) into ten parts and dividing the frequency zone between the fifth harmonic (300 Hz) and the 4-order harmonic(300−60 Hz) into ten parts.

When the measurement accuracy is lowered to ½, k=1, 2. When k=1, fx=300±30 Hz and when k=2, fx=300±60 Hz (frequencies of 6-order and 4-order harmonics) from calculation.

The control section 10 forms frequency multiplied control signals of data of the ratio to the measurement harmonic frequency for all or some of the frequencies fx found from the calculation and supplies the frequency multiplied control signals to the inject source signal generation section 11 in sequence based on reception of a signal indicating establishment of synchronization from the synchronizing signal generation section 9.

As the communication control signals are supplied, the inject source signal generation section 11 forms inject signals of the frequencies fx synchronized with the fundamental wave above and below the measurement harmonic in sequence in n cycles of the fundamental wave.

The inject signals formed by the inject source signal generation section 11 are amplified and currents of interharmonics of the frequencies fx synchronized with the fundamental wave above and below the measurement harmonic are formed. The currents occur in sequence in n cycles of the fundamental wave and are injected into the harmonic inject point 4.

As the currents are injected in n cycles of the fundamental wave, the current of each intermediate-degree harmonic is injected in Tx=(n/fs)/(1/fx) cycles and the inject cycles Tx always become integer cycles as shown in the following expression in Expression 2:

$$Tx=(n/fs)*fx=(n*m)\pm k \qquad \text{[Expression 2]}$$

The current of each intermediate-degree harmonic injected into the harmonic inject point 4 is detected with a current transformer 16.

The voltage at the harmonic inject point 4 based on the injection of the current of each intermediate-degree harmonic is detected with the transformer 7. The current flowing upstream from the harmonic inject point 4 is detected with the current transformer 8.

A detection signal of the voltage of the transformer 7 and detection signals of the currents of the current transformers 8 and 16 are supplied to an A/D conversion section 17, which then samples each detection signal while shifting the phase over n cycles of the fundamental wave in synchronization with the fundamental wave in the power system each time the current of each intermediate-degree harmonic is injected under the timing control of section 18 based on a synchronization control signal of the synchronizing signal generation section 9.

To start sampling of the A/D conversion section 17, after establishment of synchronization of the synchronizing signal generation section 9 is detected based on the signal indicating establishment of synchronization generated by the synchronizing signal generation section 9, the control section 10 gives a start (closing) instruction to the A/D conversion section 17 as well as the inject source signal generation section 11 and the switch 14.

Since the current (voltage) of each intermediate-degree harmonic is synchronized with the fundamental wave and moreover the sampling period always becomes integral multiple cycles of the fundamental wave, continuity between the sampling start and end can be held because of sampling synchronized with the fundamental wave. In this case, a frequency analysis error caused by sampling edges can be prevented without making extremely high sampling frequencies and a comparatively low-frequency, inexpensive, and simple sampling circuit can form the A/D conversion section 17.

The sampling data (measurement data) of the A/D conversion section 17 is supplied to a signal processing section 19, which then finds the admittance, etc., for the measurement harmonic on at least either the upstream or downstream side from the harmonic inject point 4 as follows:

For simplicity, assuming that the current of an intermediate-degree harmonic injected into the harmonic inject point 4 is Ix, the current Ix is a current of frequency fx which does not exist in the power system 1 and the power system 1 enters a state in which only the admittance Yx exists for the current Ix.

At this time, if the voltage at the harmonic inject point 4 based on the current Ix is Vx, the admittance Yx is found precisely from the following expression in Expression 3 without receiving the effect of the harmonics existing in the power system 1:

$$Yx=Ix/Vx \qquad \text{[Expression 3]}$$

Assuming that currents flowing upstream and downstream from the harmonic inject point 4 in the power system 1 based on the injection of the current Ix are Ix1 and Ix2 and that the admittances upstream and downstream from the harmonic inject point 4 in the power system 1 based on the currents Ix1 and Ix2 are Yx1 and Yx2, the admittances Yx1 and Yx2 are found from the following two expressions in Expressions 4 and 5:

$$Yx1=Ix1/Vx \qquad \text{[Expression 4]}$$

$$Yx2=Ix2/Vx \qquad \text{[Expression 5]}$$

If one of the currents Ix1 and Ix2 is measured, the other is found by calculation of the following expression: Ix1= Ix−Ix2 or Ix2=Ix−Ix1.

Therefore, to find the admittance on the downstream side from the harmonic inject point 4 in the power system 1, the signal processing section 19 finds the voltage Vx and the currents Ix and Ix1 by carrying out a frequency analysis such as a DFT analysis on the measurement data of the A/D conversion section 17.

At this time, the injected current is a current of integer cycles synchronized with the fundamental wave in the power system 1 and continuity between the sampling start and end can be held because of sampling synchronized with the fundamental wave. Thus, a frequency analysis error such as a DFT error caused by sampling edges does not occur.

Further, the current Ix2 of each intermediate-degree harmonic above and below the measurement harmonic on the downstream side is found by calculation of Ix2=Ix−Ix1 based on the currents Ix and Ix1.

The admittance Yx2 for each intermediate-degree harmonic above and below the measurement harmonic on the downstream side is found from Expression 5 based on the current Ix2 and the voltage Vx.

When currents of inter-harmonics of the frequencies fx found from Expression 1 are injected, currents Ix2 of inter-harmonics each above and below the measurement harmonic are found and the admittance Yx2 for each intermediate-degree harmonic is found.

At this time, the current Ix is a current of a frequency not existing in the power system 1. Thus, if the injected power amount is minute, the admittance Yx2 is found precisely without receiving the harmonic effect in the power system 1.

If a harmonic current of the measurement harmonic is injected instead of the current Ix, then the harmonic exists in the power system 1, and the admittance based on the injected harmonic current cannot be found.

Next, assuming that the admittance for the measurement harmonic on the downstream side is Ym and that the admittances for the currents Ix2 above and below the measurement harmonic are Yx2($u$) and Yx2($d$), the admittance Ym for the measurement harmonic can be found as an intermediate value of the admittances Yx2($u$) and Yx2($d$).

Thus, the signal processing section 19 executes interpolation operation by simple average, least square method, or the like based on the found admittances Yx2($u$) and Yx2($d$) and finds and determines the admittance Ym for the measurement harmonic.

At this time, if a plurality of admittances Yx2($u$) and a plurality of admittances Yx2($d$) are found, for example, a mean value (representative value) is found by simple average, least square method, etc., for each admittance Yx2($u$) and admittance Yx2($d$) and using the mean value, the interpolation operation is executed to find the admittance Ym.

At this time, the admittances Yx2($u$) and Yx2($d$) are calculated precisely without receiving the harmonic effect in the power system 1, thus the admittance Ym for the measurement harmonic is found precisely.

The current Ix2 downstream from the harmonic inject point 4 may be measured instead of the current Ix1 upstream from the harmonic inject point 4. In this case, the current Ix2 on the downstream side is found immediately from the measured current.

The admittance for the measurement harmonic on the upstream side from the harmonic inject point 4 can also be found precisely without receiving the harmonic effect in the power system 1 in a similar manner to that described above based on the currents Ix1 and Ix and the voltage Vx obtained by measurement or calculation of Ix−Ix2.

The admittances for measurement harmonics on both the upstream and downstream sides can also be found. In this case, a current transformer is installed on each of the upstream and downstream sides and the currents Ix1 and Ix2 flowing upstream and downstream may be measured.

If the admittance for the measurement harmonic on the upstream or downstream side is found, the behavior, etc., for the measurement harmonic on that side can be grasped.

By the way, in the embodiment, to more completely find not only the admittance, but also an equivalent circuit for the measurement harmonic as a parallel circuit of the admittance and a current source, the signal processing section 19 finds and determines the admittance on the upstream or downstream side for the measurement harmonic, then calculates a current source on that side for the measurement harmonic and finds an equivalent circuit as follows:

When the admittance on the upstream or downstream side for the measurement harmonic is found, after terminating the injection of the currents of intermediate-degree harmonic, the measurement harmonic voltage (harmonic voltage) and current (harmonic current) in the power system 1 are found by performing a frequency analysis on the measurement data of the A/D conversion section 17 based on the detection signals of the transformer 7 and the current transformer 8 with the switch 14 open.

Assuming that the found harmonic voltage is Vm, the found harmonic current is Im (upstream to downstream direction is positive), and the admittances and current sources of the equivalent circuits for the measurement harmonics above and below the harmonic inject point 4 are Ym1 and Ym2 and IGm1 and IGm2 (direction flowing into the harmonic inject point 4 is positive), as seen from the equivalent circuits shown in FIG. 2, the following two expressions in Expressions 6 and 7 hold for the downstream and upstream side from the harmonic inject point 4:

$IGm1=Im+Vm\cdot Ym1$  [Expression 6]

$IGm2=Vm\cdot Ym2-Im$  [Expression 7]

Figure 2:
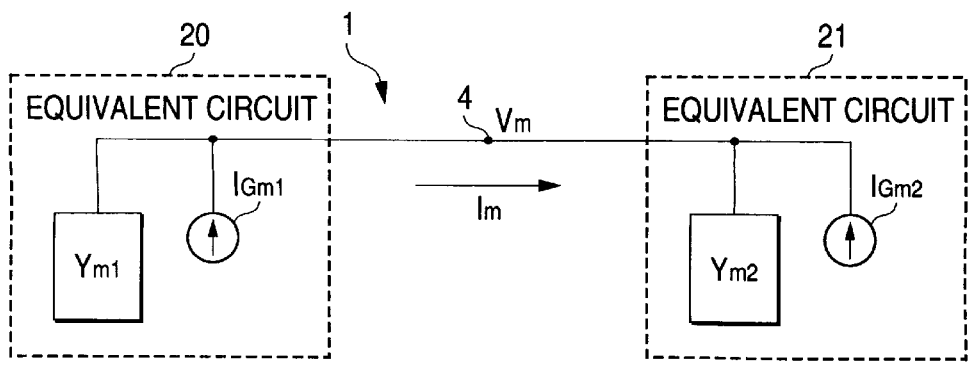
FIG. 2 is harmonic equivalent circuit diagrams in a power system in FIG. 1.

Then, the signal processing section 19 finds and determines either or both of the current sources IGm1 and IGm2 of the measurement harmonics by calculation of either or both of the two expressions in Expressions 6 and 7 and finds and determines either or both of the equivalent circuits 20 and 21 for the measurement harmonics shown in FIG. 2.

In this case, the equivalent circuits 20 and 21 for the measurement harmonics on the upstream or downstream side can be found separately with accuracy.

The circuit constants Ym1, Ym2, IGm1, IGm2, etc., of the equivalent circuits 20 and 21 on the upstream or downstream side are stored in a storage section (not shown) in the measuring apparatus 5 and are displayed on a screen of a display section (not shown) in an equivalent circuit diagram format, for example.

To decrease harmonics caused by system change, etc., the above described measurement is repeated, the most recent state of the equivalent circuit 20, 21 on the upstream or downstream is determined, the occurrence of harmonics accompanying system change is predicted from the result, etc., and the optimum filter capacity of the filter (not shown) connected to the harmonic inject point 4 is set.

(Another Form of First Embodiment)

Next, a form will be discussed wherein a harmonic equivalent circuit in the power system 1 is a series circuit of an impedance and a voltage source and the impedance for the measurement harmonic on the upstream or downstream side or an equivalent circuit of the impedance and voltage source is found.

In this form, if a voltage Vx, of an intermediate-degree harmonic fx found from Expression 1, is applied to the harmonic inject point 4 in n cycles of the fundamental wave and is measured, an expression provided by changing the admittance Yx in Expression 3 to an impedance Zx (=1/Yx) holds and the following two expressions in Expressions 8 and 9 hold as expressions corresponding to the two expressions in Expressions 4 and 5:

$Zx1=Vx/Ix1$  [Expression 8]

$Zx2=Vx/Ix2$  [Expression 9]

Then, the signal processing section 19 finds impedances Zx1 (=Zx1($u$) and Zx1($d$)), Zx2 (=Zx2($u$) and Zx2($d$)) for inter-harmonics above and below the fundamental wave on the upstream or downstream side from Expression 8 or 9 based on the measured voltage Vx at the harmonic inject point 4 and the downstream or upstream current Ix1, Ix2.

Further, interpolation processing similar to that described above is applied to the impedances Zx1 or Zx2 for the inter-harmonics above and below the fundamental wave and the impedance Zm (=1/Ym) for the measurement harmonic is found and determined.

To find an equivalent circuit consisting of the impedance Zm and a voltage source, the voltage Vm and current Im of the measurement harmonic at the harmonic inject point 4 are measured and a voltage source corresponding to the current source IGm1, IGm2 in FIG. 2 is found and determined by calculation of an expression corresponding to Expression 6, 7.

A current of an intermediate-degree harmonic is injected and the impedances Zx1, Zx2 are found from Expression 8, 9, whereby the impedance Zm and equivalent circuit for the measurement harmonic can also be found.

In the first embodiment and another form of the first embodiment, the frequencies fx of the currents or voltages of the inter-harmonics above and below the measurement harmonic are found by calculation of the extremely simple expression in Expression 1 considering measurement accuracy, etc., and the method is extremely useful particularly to inject or apply a plurality of currents or voltages of inter-harmonics.

Further, the current (voltage) of each intermediate-degree harmonic is synchronized with the fundamental wave and moreover the injecting (applying) period is set to n cycles of the fundamental wave. At this time, the current (voltage) of the intermediate-degree harmonic is always injected in integral multiple cycles of the fundamental wave. Thus, when a frequency analysis such as DFT analysis is applied to the result, etc., based on injecting (applying) of the current (voltage) and the admittances (impedances) for the inter-harmonics above and below the fundamental wave on the upstream or downstream side in the power system are found, continuity between the sampling start and termination ends can be held because of sampling synchronized with the fundamental wave and a frequency analysis error, etc., caused by sampling edges can be prevented without making high sampling frequencies for making extremely high frequency resolution; inexpensive and easy measurement can be executed with high accuracy.

[Advantages of the Invention]

The invention provides the following advantages:

The injected currents (applied voltages) of frequencies of non-integral multiples of the fundamental wave above and below the measurement harmonic can be found as currents (voltages) of inter-harmonics of appropriate frequencies synchronized with the fundamental wave by calculation of a simple expression considering measurement accuracy.

Since the current (voltage) of the intermediate-degree harmonic is injected or applied over n cycles of the fundamental wave, the period of injecting the current (voltage) of the intermediate-degree harmonic can always be set to integer cycles (m*n±k).

Therefore, if current (voltage), in the power system 1 based on the injecting (applying) of current (voltage) of intermediate-degree harmonic in integer cycles is measured and current (voltage) of intermediate-degree harmonic in integer cycles in the power system 1 is sampled in synchronization with the fundamental wave for carrying out a frequency analysis, etc., thereon, a frequency analysis error, etc., caused by sampling edges can be prevented without making extremely high sampling frequencies and the admittances (impedances) for the inter-harmonics above and below the measurement harmonic on the upstream or downstream side in the power system can be found.

The admittance (impedance) or equivalent circuit for the measurement harmonic can be found with the desired measurement accuracy from the result and accurate measurement of the admittance (impedance) or equivalent circuit for harmonics in the power system 1 previously impossible can be executed based on easy signal injecting type operations.

(Second embodiment)

A second embodiment of the invention will be discussed with reference to FIGS. 3 to FIG. 6.

Figure 3:
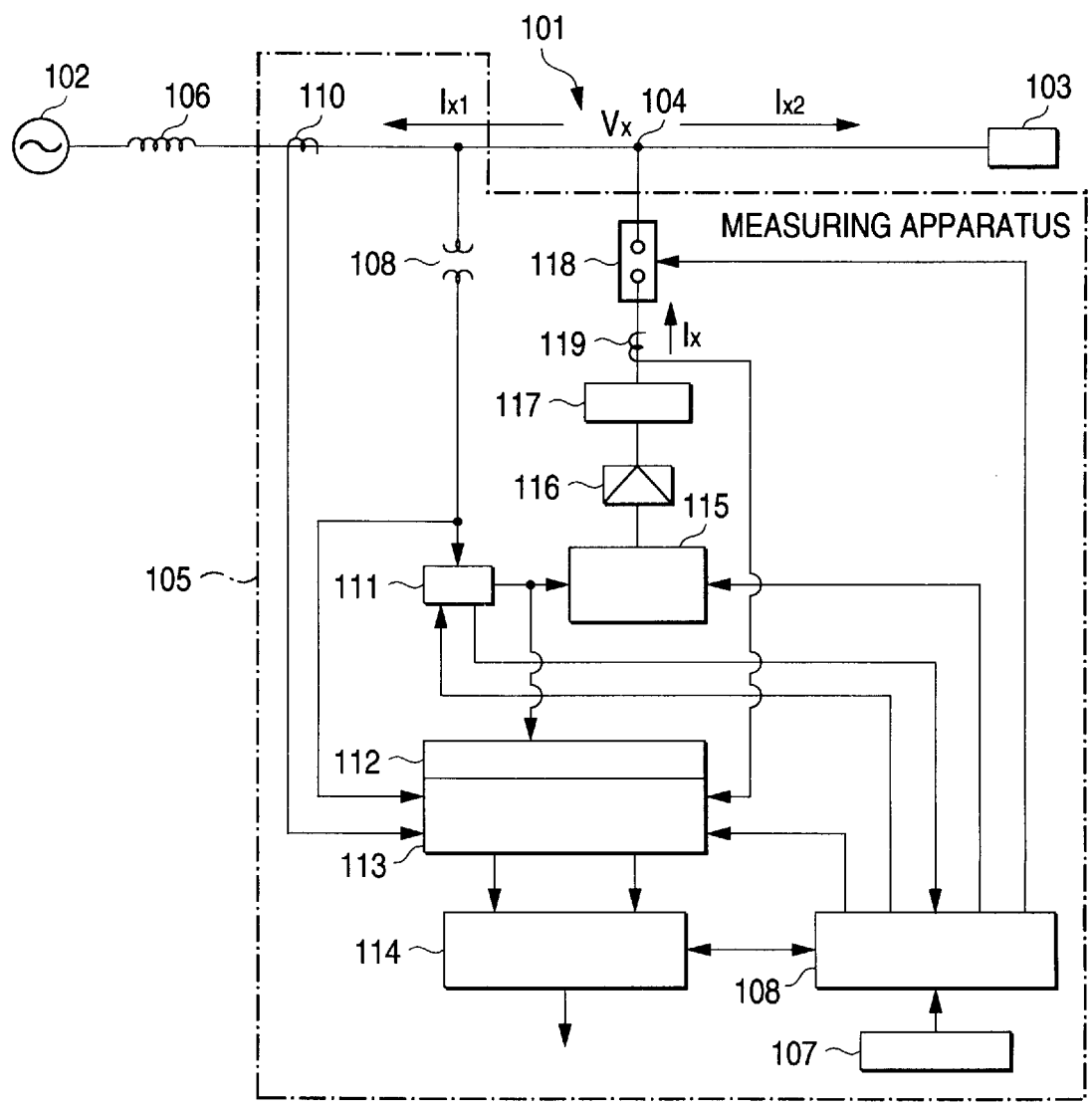
FIG. 3 is a circuit block diagram of a second embodiment of the invention.
Figure 4:
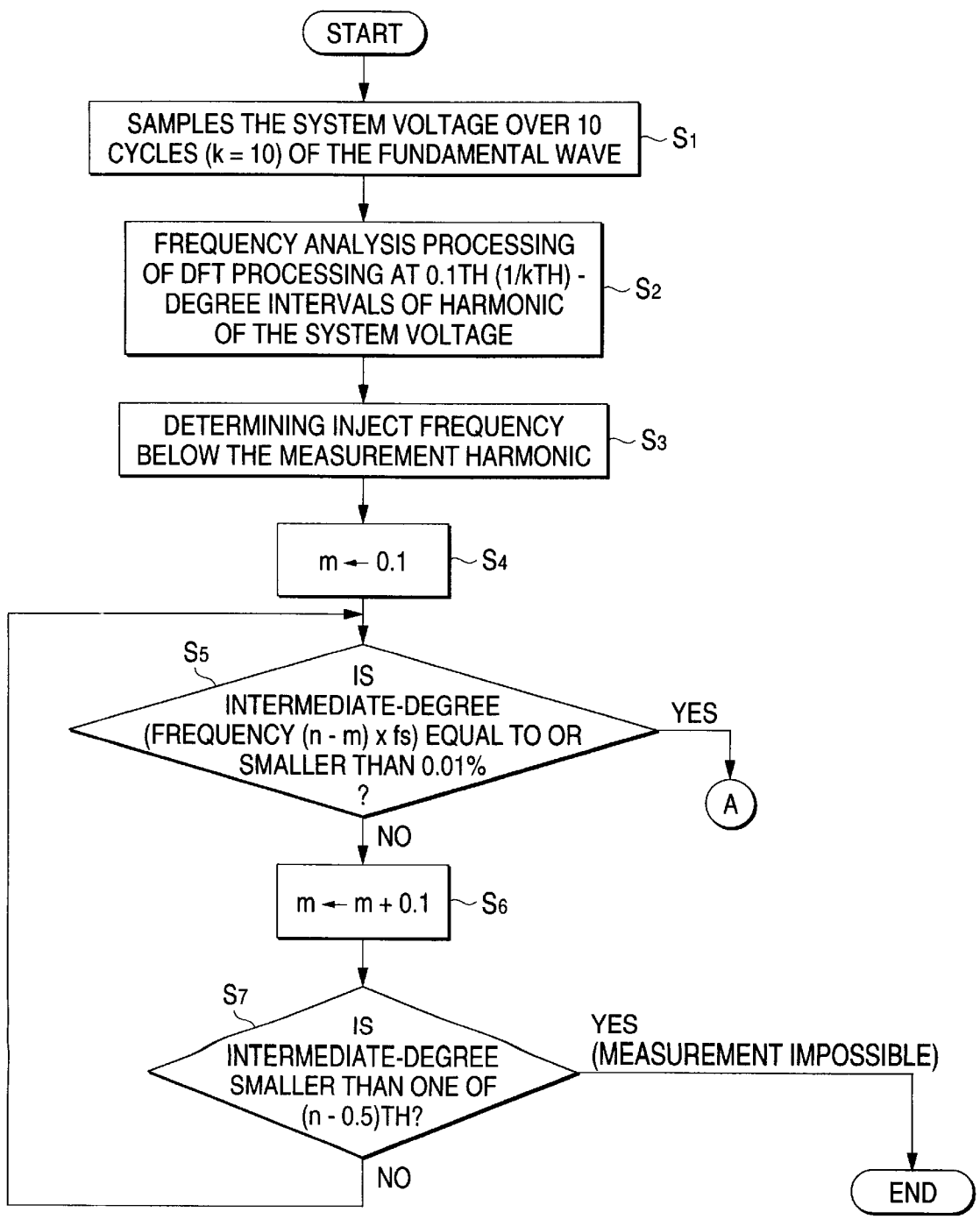
FIG. 4 is a first flowchart for determining inject frequencies in FIG. 3.
Figure 5:
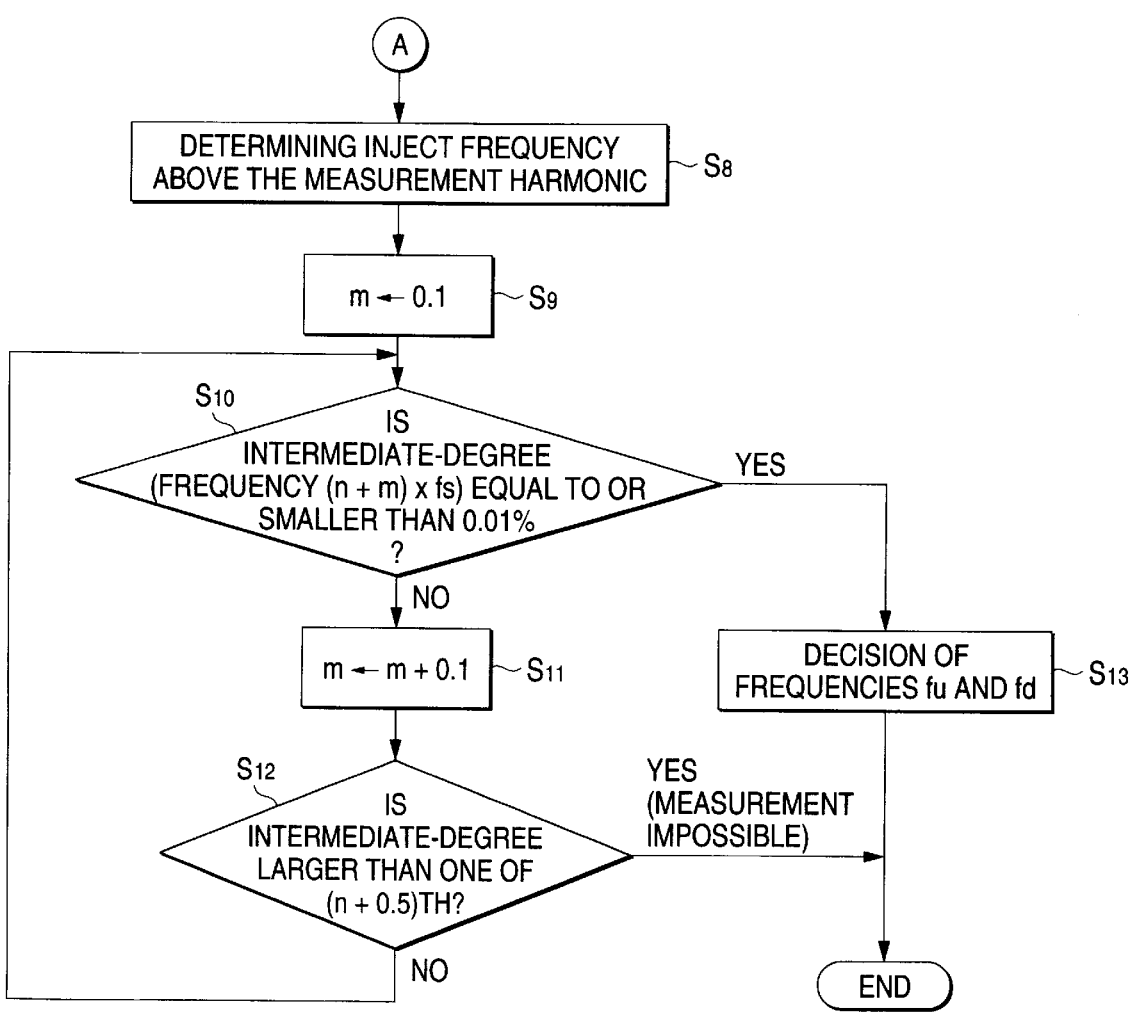
FIG. 5 is a second flowchart for determining inject frequencies in FIG. 3.
Figure 6:
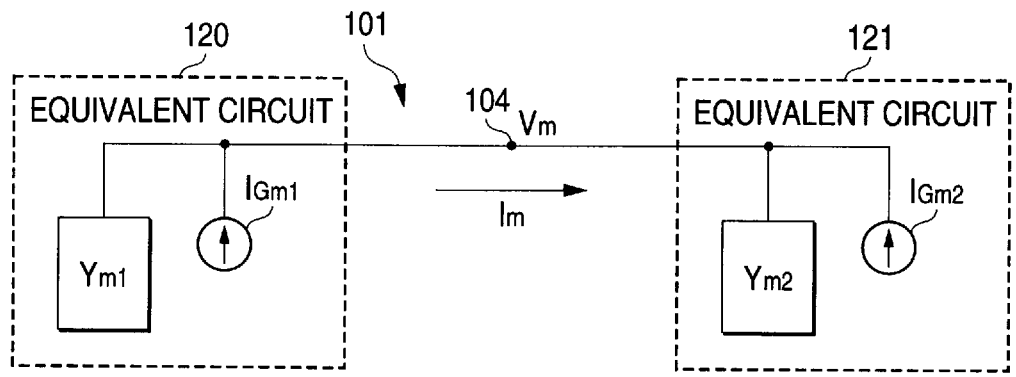
FIG. 6 is measurement harmonic equivalent circuit diagrams in a power system in FIG. 3.

The power system of FIG. 3 is similar to the power system of FIG. 1. In addition to a fundamental wave of frequency fs, harmonics of frequencies of integral multiples of the fundamental wave and inter-harmonics of frequencies of non-integral multiples of the fundamental wave exist in the power system 101. According to the second embodiment of the invention, the frequency for the intermediate-degree harmonic current is set as follows:

When the nth-degree harmonic (n=1, 2, . . . ) such as the fifth harmonic is adopted as a measurement harmonic and the ever-changing admittances (time constants) upstream and downstream from the harmonic inject point 104 for the measurement harmonic are found, first a control section 108 executes control of an inject frequency determination process before measurement in FIG. 4 and FIG. 5 to detect and identify inter-harmonics synchronized with the fundamental wave, of the frequencies of non-integral multiples of the fundamental wave not present in the power system 1 or extremely small if present above and below the measurement harmonic of the system voltage based on a start operation at an operation section 107.

If the measurement accuracy 1/k (1<k) is set to 0.1 (k=10), based on processing of the control section 108 at step S1 in FIG. 4, the A/D conversion section 113 samples the system voltage (i.e., the detected voltage signal of the transformer 109) over 10 cycles of the fundamental wave while shifting the sampling phase and forms system voltage measurement data.

At step 52 in FIG. 4, the system voltage measurement data is supplied to a signal processing section 114, which then performs analog frequency analysis processing or digital frequency analysis processing of DFT processing, FFT processing, etc., thereby carrying out a frequency analysis at 0.1th-degree intervals of harmonic of the system voltage.

Then, control goes to step S3 in FIG. 4 for determining an inject frequency below the measurement harmonic (lower frequency fd). If the nth-degree harmonic of frequency n*fs is the measurement harmonic, at steps S4–S7 of the control section 108, the signal processing section 114 detects the magnitude (voltage) of the (n−m)th-degree intermediate-degree harmonic (0<m<1) in 0.1th-degree steps between the system voltage measurement harmonic (nth-degree harmonic) and the (n−1)th-degree harmonic starting at the harmonic closest to the measurement harmonic. The signal processing section 114 then compares the detected magnitude (voltage) with a setup value, finds the lower intermediate-degree harmonic equal to or less than the setup value, closest to the system voltage measurement harmonic, and determines the injected current frequency (inject frequency) below the measurement harmonic.

At this time, considering a measurement error, the setup value is set to, for example, the 0.01% magnitude (voltage) of the fundamental wave and the lower limit of the intermediate-degree harmonic whose magnitude (voltage) is to be detected is actually set to, for example, (n−0.5)th-degree (m=0.5).

Although the intermediate-degree harmonic whose magnitude (voltage) is detected becomes (n−0.5)th degree, if the magnitude is larger than 0.01% of the fundamental wave, a comparatively large voltage of an intermediate-degree harmonic not originally existing in the power system 101 exists in the proximity of the measurement harmonic and precise measurement based on the injected current cannot be executed, thus YES is returned at step S7 in FIG. 4 and the control section 108 forcibly terminates the processing.

On the other hand, if the intermediate-degree harmonic closest to the measurement harmonic of a magnitude equal to or less than 0.01% of the fundamental wave is detected in any of the (n−0.1)th degree, . . . , (n−0.5)th degree, then the frequency of the intermediate-degree harmonic is determined to be the lower frequency fd and YES is returned at step S5 in FIG. 4. Control then goes to step S8 in FIG. 5 for determining an inject frequency above the measurement harmonic (upper frequency fu).

At steps S9–S12 of the control section 108, the signal processing section 114 detects the magnitude (voltage) of the (n+m)th degree intermediate-degree harmonic in 0.1th-degree steps between the system voltage measurement harmonic and the (n+1)th-degree harmonic starting at the harmonic closest to the measurement harmonic. The signal processing section 114 then compares the detected magnitude (voltage) with a setup value, finds the upper intermediate-degree harmonic equal to or less than the setup value, closest to the system voltage measurement harmonic, and determines the injected current frequency above the measurement harmonic (upper frequency fu) as with determination of the lower frequency fd.

At step S13 in FIG. 5, based on the measurement result of the signal processing section 114, the control section 108 determines the frequencies closest to the measurement harmonic, of inter-harmonics not present in the power system 101 or extremely small if present above and below the measurement harmonic to be the injected current frequencies (upper frequency fu and lower frequency fd).

Next, to inject currents of the inter-harmonics of the determined frequencies into the power system 101 and find the admittance on the attention side of the power system 101 for the measurement harmonic, the control section goes to the inject control.

Under the control of the control section 108, an inject source signal generation section 115 generates inject source signals of the upper frequency fu and the lower frequency fd synchronized with the fundamental wave in the power system 101 based on a synchronization control signal of the synchronizing signal generation section 11. The signals are amplified by an amplifier 116, and currents of the inter-harmonics of the upper frequency fu and the lower frequency fd synchronized with the fundamental wave are formed and are injected into the harmonic inject point 104 via an injecting circuit 117 and a switch 118.

The admittance and equivalent circuit for the measurement harmonic are found in the same manner as in the first embodiment.

(Another Form of Second Embodiment)

Next, a form will be discussed wherein a harmonic equivalent circuit in the power system 101 is a series circuit of an impedance and a voltage source and the impedance for the measurement harmonic on the upstream or downstream side or an equivalent circuit of series connection of the impedance and voltage source is found.

In this form, first the control section 108 performs an applied frequency determination process control similar to the applied frequency determination process control before measurement in FIG. 4 and FIG. 5.

The applied voltage frequencies fu and fd above and below the measurement harmonic are determined by executing the same process as steps S1–S13 in FIG. 4 and FIG. 5.

Next, control goes to measurement and the voltages of the determined frequencies fu and fd are applied to the harmonic inject point. The impedance and equivalent circuit for the measurement harmonic is found in the same manner as in the first embodiment.

In the same embodiment and another form of the second embodiment, the frequencies of the injected currents (applied voltages) of the inter-harmonics above and below the measurement harmonic are determined to be the frequencies closest to the measurement harmonic of the frequency of a non-integral multiple of the fundamental wave not present in the power system 101 or extremely small if present by carrying out previous system voltage frequency analysis, and the admittance (impedance) or equivalent circuit on the upstream or downstream side for the measurement harmonic are found precisely from the measurement result based on injecting the currents (or applying the voltages) of the inter-harmonics of the determined frequencies.

Moreover, the injected current (applied voltage) is synchronized with the fundamental wave and a frequency analysis is carried out on the sampling data in integer multiple cycles of the fundamental wave. Thus, a frequency analysis error is prevented, the admittance (impedance) or equivalent circuit on the attention side is found more precisely, and measurement with high accuracy can be executed.

[Advantages of the Invention]

The invention provides the following advantages:

Before measurement, a frequency analysis of the system voltage at the harmonic inject point 104 in the power system 101 is carried out. Detected from the analysis result are frequency components of non-integral multiplies of the fundamental wave synchronized therewith, of magnitudes equal to or less than the setup up value closest to the measurement harmonic above and below the measurement harmonic in the system voltage. The frequencies are determined frequencies of injected currents or applied voltages above and below the measurement harmonic and the injected currents or applied voltages at the measurement time can be set to currents or voltages of frequencies of non-integral multiples of the fundamental wave closest to the measurement harmonic, less affected by the power system 101.

At the measurement time, the injected currents (applied voltages) of the inter-harmonics of the determined frequencies above and below the measurement harmonic are injected into (applied to) the harmonic inject point 104 in the power system 101 and the admittances or impedances for the inter-harmonics of the injected currents (applied voltages) on the attention side are found from the voltage, current measurement result in the power system based on injecting the currents (applying the voltages), then the admittance or impedance for the measurement harmonic on the attention side is found and determined from an intermediate value of the admittances or impedances.

At this time, the injected currents (applied voltages) above and below the measurement harmonic are set to currents (voltages) of the inter-harmonics with extremely small effect of the power system 101 and closest to the measurement harmonic not present in the power system 101 or of magnitudes equal to or less than the setup value if present based on the actual measurement result. Thus, the admittance or impedance for the measurement harmonic on the attention side in the power system is found reliably with accuracy by injecting current (applying voltage) of a small capacity and can be used to find an equivalent circuit precisely.

[Third Embodiment]

Figure 7:
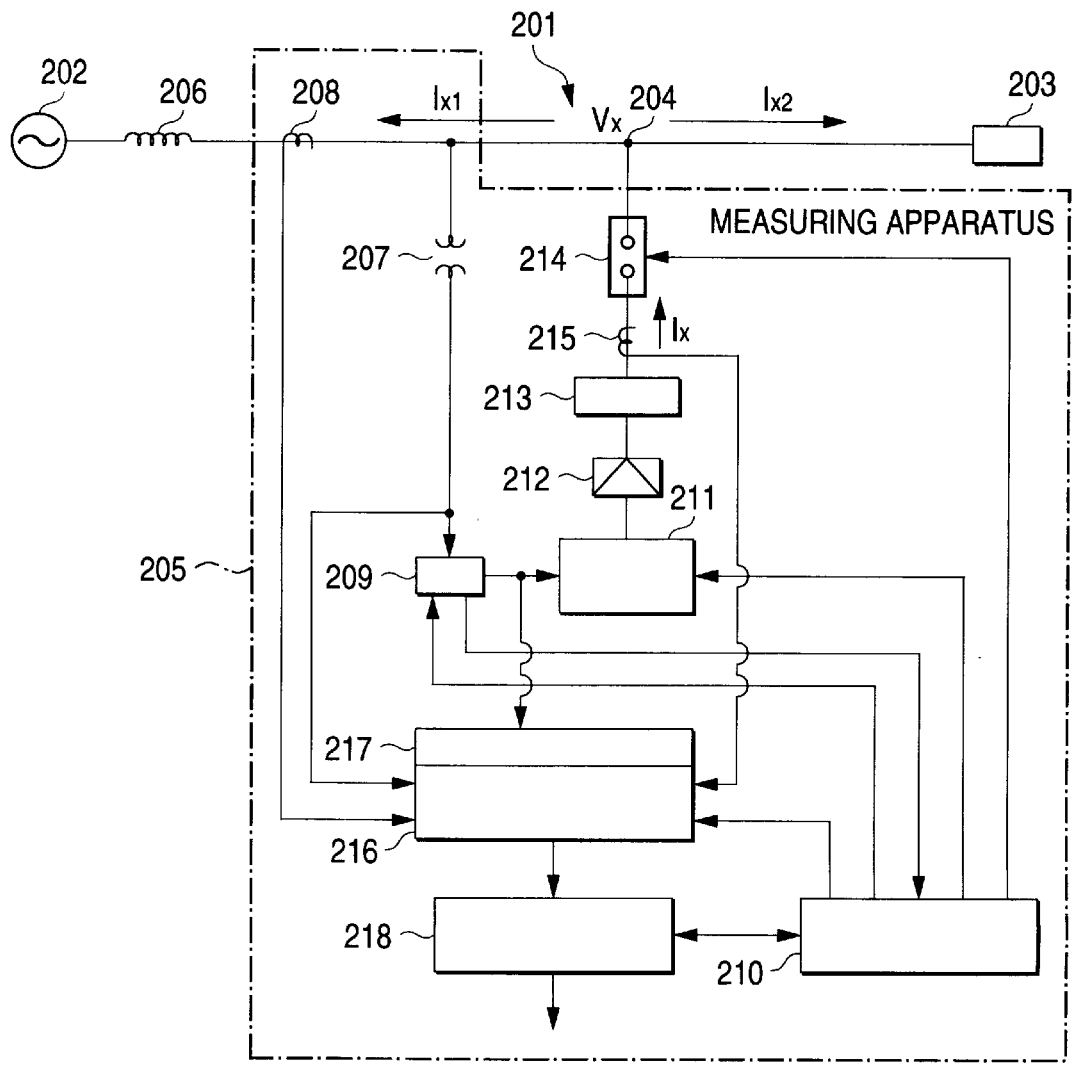
FIG. 7 is a circuit block diagram of a third embodiment of the invention.

A third embodiment of the invention will be discussed with reference to FIG. 7 to FIG. 12. The power system of FIG. 7 is similar to the power system of FIG. 1.

According to the third embodiment of the invention, an injecting technique of the injected currents above and below the measurement harmonic will be discussed.

Figure 8:
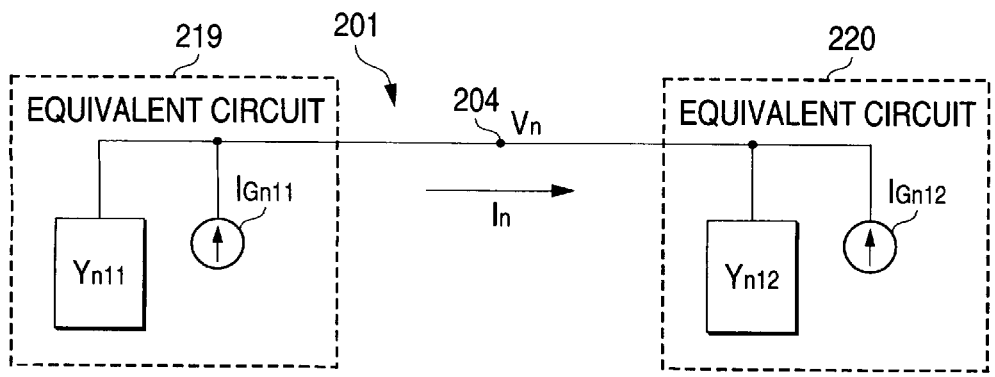
FIG. 8 is harmonic equivalent circuit diagrams in a power system in FIG. 7.

First, equivalent circuits upstream and downstream from the harmonic inject point 204 for the nth-degree harmonic in the power system 201 can be assumed to be a parallel circuit of admittance Yn11 and a current source Gn11 and that of admittance Yn12 and a current source Gn12 as shown in equivalent circuits 219 and 220 in FIG. 8.

Equivalent circuits in the power system 201 for frequencies of nonintegral multiples of the fundamental wave above and below the nth-degree harmonic become admittance only because components of the frequencies originally do not exist.

Assuming that the power system 201 is a 1-KVA-based small capacity load circuit model easily causing voltage distortion as harmonics are injected, that the measurement harmonic is 5th-degree harmonic (n=5), and that the injected currents of frequencies of non-integral multiples of the fundamental wave above and below the 5th-degree harmonic are currents of inter-harmonics of 5.5th-degree and 4.5th-degree harmonics synchronized with the fundamental wave, it turned out from various experiments that if about 0.3% voltage distortion is given to the fundamental wave voltage by injecting current, the admittances Yn11 and Yn12 and the equivalent circuits 219 and 220 for the measurement harmonic on the attention side can be found from the measurement result without adversely affecting the load on the power system 201.

On the other hand, when resonance points in the power system 201 become frequencies of the inter-harmonics of the 5.5th-degree and 4.5th-degree harmonics or frequencies in the proximity thereof, if current of the intermediate-degree harmonic of the 5.5th-degree or 4.5th-degree harmonic is injected, a large distortion voltage exceeding 0.3% occurs in the power system 201.

Figure 9:
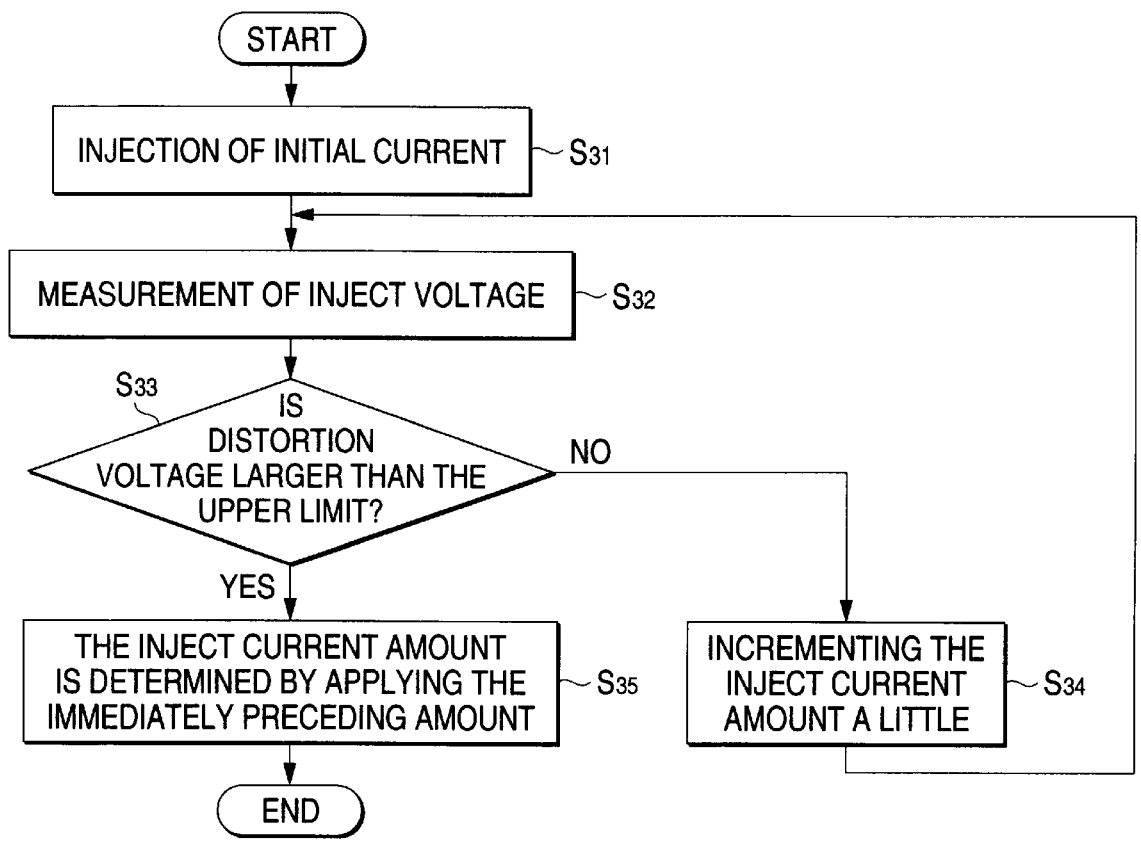
FIG. 9 is a flowchart of a injected current amount determination process in FIG. 7.

Then, the 0.3% distortion voltage of the fundamental wave voltage is set to a predetermined upper limit voltage (threshold value) and the control section 210 executes a injected current amount determination process in FIG. 9 for each injected current for determining the injected current amount of interharmonics at steps S31–S35.

That is, when the harmonic degrees or frequencies of injected currents above and below the measurement harmonic are given to the control section 210 through keyboard operation, etc., the control section 210 first adopts, for example, the frequency of the 4.5th-degree harmonic below the measurement harmonic [when the fumdamental wave is 60 Hz, 270 Hz {=(240+300)/2}] as a inject frequency, controls a signal gain of the inject source signal generation section 211 so as to generate a inject signal of an initial inject amount (start level) of the inject frequency, and injects the initial inject amount of current of the 4.5th-degree harmonic into the harmonic inject point 204 at step S31.

Next, at step S32, voltage measurement data of the A/D conversion section 216 based on a measurement signal of the transformer 207 is analyzed and processed by the signal processing section 218 for detecting a distortion voltage in the power system 201 based on injecting of the 4.5th-degree harmonic current.

The detection result (distortion voltage) is transmitted to the control section 210, which then compares the transmitted distortion voltage with the upper limit voltage at step S33 and executes a loop of steps S32 to S34 until the transmitted distortion voltage reaches the upper limit voltage by incrementing the injected current amount a little, for example, by constant amount ΔI and injecting the increased amount of current into the power system 201.

When the distortion voltage based on the injected current rises to the upper limit voltage, control goes from step S33 to step S35. The injected current amount is decremented by constant amount ΔI and is restored to the immediately preceding amount for determining the injected current amount to be the amount causing almost 0.3% distortion voltage of the fundamental wave, then the current amount determination process is terminated.

After the current amount determination process is terminated, control goes to harmonic measurement. The determined amount of 4.5th-degree harmonic current is injected into the harmonic inject point 204 and the admittance on the attention side in the power system 201 for the 4.5th-degree harmonic is found from the measurement result of the transformer 207 and the current transformers 208 and 215.

Further, when the admittance for the 4.5th-degree harmonic is found, the control section 210 sets the frequency of the 5.5th-degree harmonic above the measurement harmonic (when the fundamental wave is 60 Hz, 330 Hz {=(300+360)/2}] as a inject frequency and again executes the injected current amount determination process in FIG. 9 for injecting the 5.5th-degree harmonic current into the harmonic inject point 204 while increasing the current amount gradually as for the 4.5th-degree harmonic described above.

When the distortion voltage in the power system 201 based on the injected 5.5th-degree harmonic current grows almost to 0.3% of the fundamental wave voltage, the injected current amount is determined the amount. Then, control goes to harmonic measurement and the admittance on the attention side for the 5.5th-degree harmonic is found.

Therefore, each of the injected currents of the 5.5th-degree and 4.5th-degree harmonics above and below the measurement harmonic (5th-degree harmonic) is automatically set to the optimum inject amount immediately preceding the current amount causing almost 0.3% distortion voltage of the fundamental wave voltage in the power system 201 by current injecting and the admittances for the 5.5th-degree and 4.5th-degree harmonics on the attention side in the power system 201 are found based on injecting of the optimum amounts of currents.

In this case, if the injected current frequency is the frequency of the resonance point in the power system 201 or the frequency in the proximity thereof, excessive voltage distortion does not occur in the power system 201 and the admittance on the attention side for the inject frequency is found precisely without adversely affecting the load on the power system 201.

By the way, the initial injecting amount of current and the change amount Al may be the same constant value; for example, they may increase or decrease linearly or non-linearly.

Figure 10:
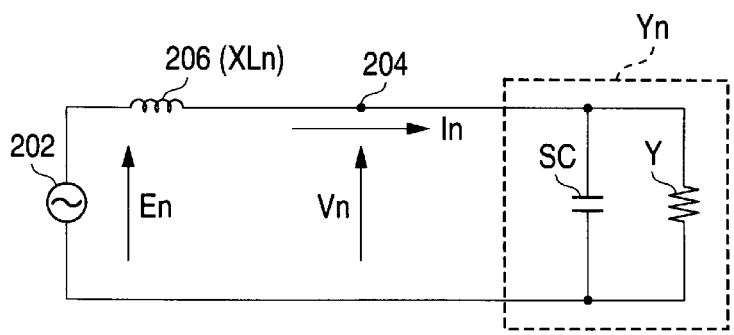
FIG. 10 is a first equivalent circuit diagram to describe determination of injected current in FIG. 7.

The optimum injecting amount may be determined by increasing the injected current starting at zero, but preferably on practical use, it is determined by increasing the injected current starting at the inject amount considering a voltage enlargement ratio at a resonance point as follows:

If the power system 201 is based on 10 MVA, for example, and the downstream side from the harmonic inject point 204 is adopted as the attention side, the parallel circuit of the admittance Yn12 and the current source IGn12 in FIG. 8 can be represented as admittance Yn of nth-degree harmonic equivalent circuit as shown in FIG. 10 and the admittance Yn is nth-degree admittance comprising capacity component SC and resistance load component Y combined in parallel.

At this time, assuming that the nth-degree harmonic voltage of the system power supply 202 is En and that wiring impedance 206 for the nth-degree harmonic based mainly on impedance of the power distribution transformer is jXLn, the nth-degree harmonic voltage Vn at the harmonic inject point 204 is expressed in the following expression in Expression 17:

$$Vn = En/(1+jXLn \cdot Yn) \qquad \text{[Expression 17]}$$

Further, the voltage enlargement ratio is expressed in Vn/En and is found from the absolute value of $1/(1+jXLn \cdot Yn)$ based on the expression in Expression 17.

Figure 11:
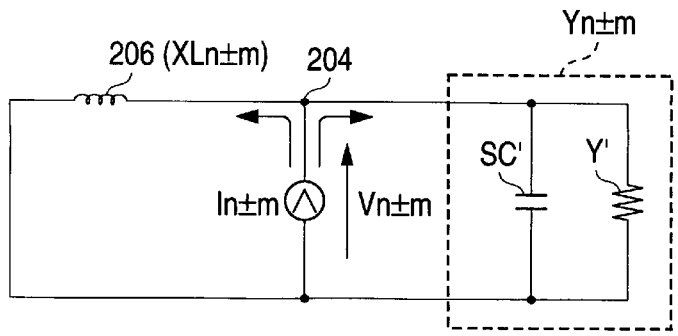
FIG. 11 is a resonance characteristic measurement chart.

If the resistance load component Y is set to 1000% load (1-MW load) and the capacitor component SC is made variable from 0% to 100% (0–10 MVA) for the 5th-degree harmonic (n=5), it is seen as shown in the actual measurement result in FIG. 11 that the voltage enlargement ratio Vn/En changes almost in the range of 1 to 25 and that if resonates, it is enlarged by 25 times.

Figure 12:
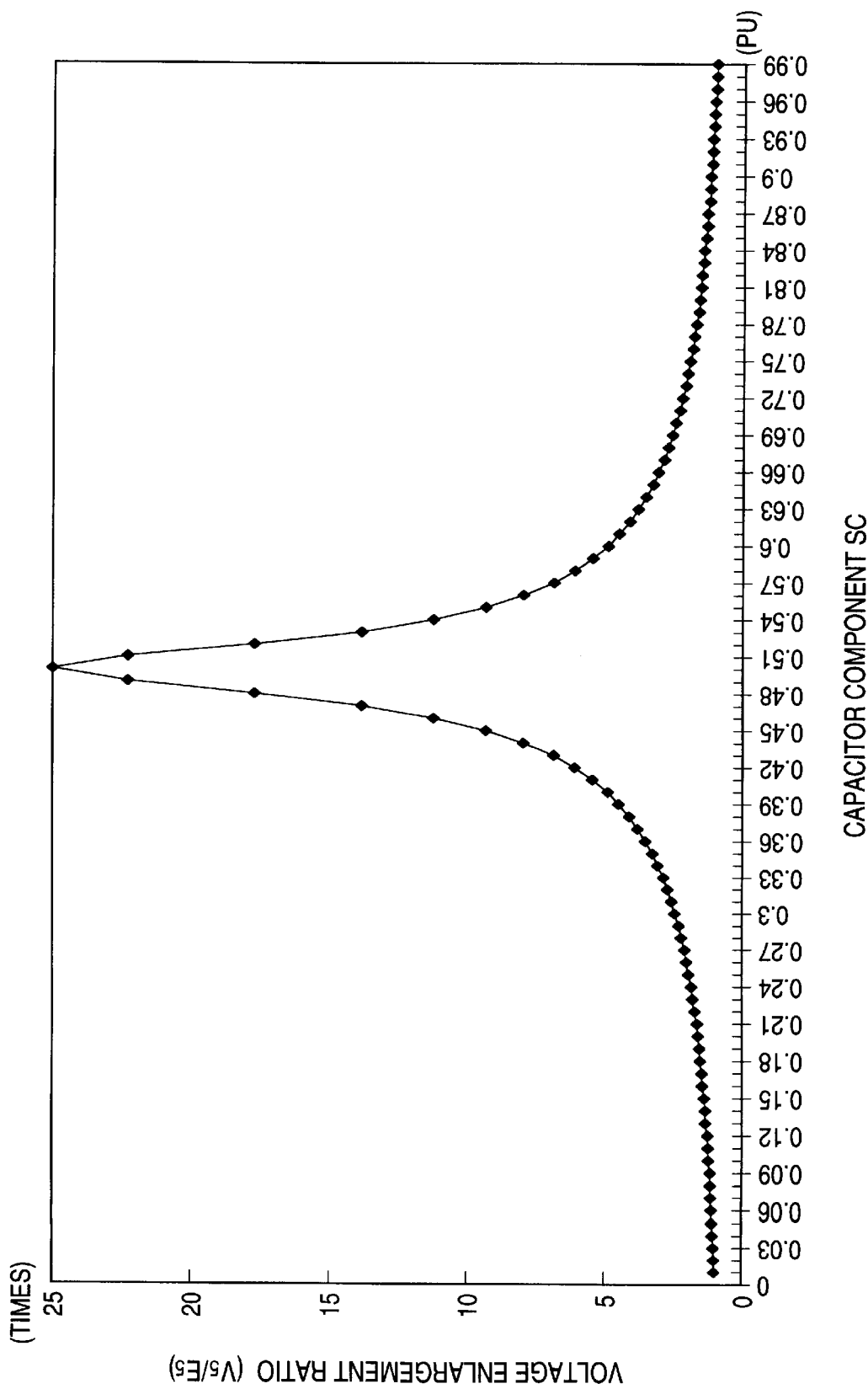
FIG. 12 is a second equivalent circuit diagram to describe determination of injected current in FIG. 7.

Next, assuming that inter-harmonics not existing in the power system 201 above and below the nth-degree harmonic are (n±m)th-degree harmonics (0<m<1), when currents In±m of the (n±m)th-degree harmonics are injected into the harmonic inject point 204, an equivalent circuit in the power system 201 similar to that in FIG. 10 becomes as shown in FIG. 12.

In FIG. 12, admittances Yn±m on the attention side downstream from the harmonic inject point 204 comprise capacity component SC' and resistance load component Y' combined in parallel. Assuming that the wiring impedance 206 is jXLn±m, voltages Vn±m at the harmonic inject point 204 are expressed in the following expression in Expression 18:

$$Vn \pm m = (jXLn \pm m \cdot In \pm m)/(1+jXLn \pm m \cdot Yn \pm m) \qquad \text{[Expression 18]}$$

Setting In=In±m, Vn=Vn±m, XLn=XLn±m, and Yn=Yn±m in the expressions in Expressions 17 and 18, the common denominators of both the expressions become equal and the expression in Expression 18 can be represented as the following expression in Expression 19:

$$Vn \pm m = (jXLn \cdot In) \cdot \text{voltage enlargement ratio} \qquad \text{[Expression 19]}$$

This expression in Expression 19 means that, for example, when intermediate-degree harmonic currents in the proximity above and below the 5th-degree harmonic (n=5), if the voltage enlargement ratio is 25 (maximum), the same voltage distortion as when the voltage enlargement ratio is 1 (minimum) occurs in 1/25 the current amount when the voltage enlargement ratio is 1 and that if the same amount of current is injected, voltage distortion becomes too much or too little depending on the state of the power system 201.

Then, when the measurement harmonic is the 5th-degree harmonic and 0.3% of the fundamental wave voltage is the upper limit voltage (threshold value), each of the initial inject amounts of intermediate-order harmonic currents above and below the measurement harmonic is set to the amount in which the distortion voltage caused by current injecting becomes 1/25 of 0.3% of the fundamental wave voltage, and the current amount is increased starting at the inject amount for determining the injected current amount.

The admittance and equivalent circuit for the measurement harmonic are found in the same manner as in the first embodiment.

In the third embodiment, each of the injected currents of the intermediate harmonics above and below the measurement harmonic is actually injected into the power system 201 while the inject amount is increased gradually, and based on the injecting result, each of the injected currents is set to the optimum current amount immediately preceding the current amount adversely affecting the load on the power system 201. Then the admittances Yn11 and Yn12 or the equivalent circuits 219 and 220 for the measurement harmonics are found based on injecting the optimum amounts of currents. Thus, the circuit characteristics for the harmonics in the power system 201 can be found precisely without incurring trouble caused by injecting harmonics in the power system 201.

The injected currents above and below the measurement harmonic may be currents of proper frequencies of nonintegral multiples of the fundamental wave not synchronized with the fundamental wave or a plurality of currents above the measurement harmonic and a plurality of currents below the measurement harmonic may be injected.

To inject currents above the measurement harmonic and currents below the measurement harmonic, for example, the admittance may be found for each injected current above and below the measurement harmonic and a mean value, etc., of the found admittances may be found for finding the admittance for the measurement harmonic. The upper limit voltage value, etc., may be set in response to the state, etc., of the power system 201.

[Advantages of the Invention]

The invention provides the following advantages:

First, in the invention as claimed in claim 5, based on repeating the step of injecting the currents of the frequencies of nonintegral multiples of the fundamental wave above and below the measurement harmonic into a harmonic inject point in the power system 201 while gradually increasing the currents and the step of measuring distortion voltage of inject frequencies, each current is previously set to the current amount immediately preceding the current amount causing excessive distortion voltage in the power system 201, namely, the optimum current amount not adversely affecting the load on the power system 201 although current is injected.

As the optimum inject amounts of currents are injected, the admittances on the attention side in the power system 201 for the injected currents of the frequencies of nonintegral multiples of the fundamental wave above and below the measurement harmonic can be found accurately without adversely affecting the load on the power system 201 and the admittance for the measurement harmonic on the attention side in the power system 201 can be found precisely from the result without incurring trouble caused by injecting harmonics.

In the invention as claimed in claim 6, from the admittance for the measurement harmonic on the attention side in the power system 201 found in a similar manner to that in claim 5 and the measurement harmonic voltage and current measurement results in the power system 201, the measurement harmonic current source parallel with the admittance on the attention side in the power system 201 can be found and the equivalent circuit for the measurement harmonic, made of a parallel circuit of the admittance on the attention side in the power system 201 and the current source can be found precisely without adversely affecting the load on the power system 201.

[Fourth Embodiment]

Figure 13:
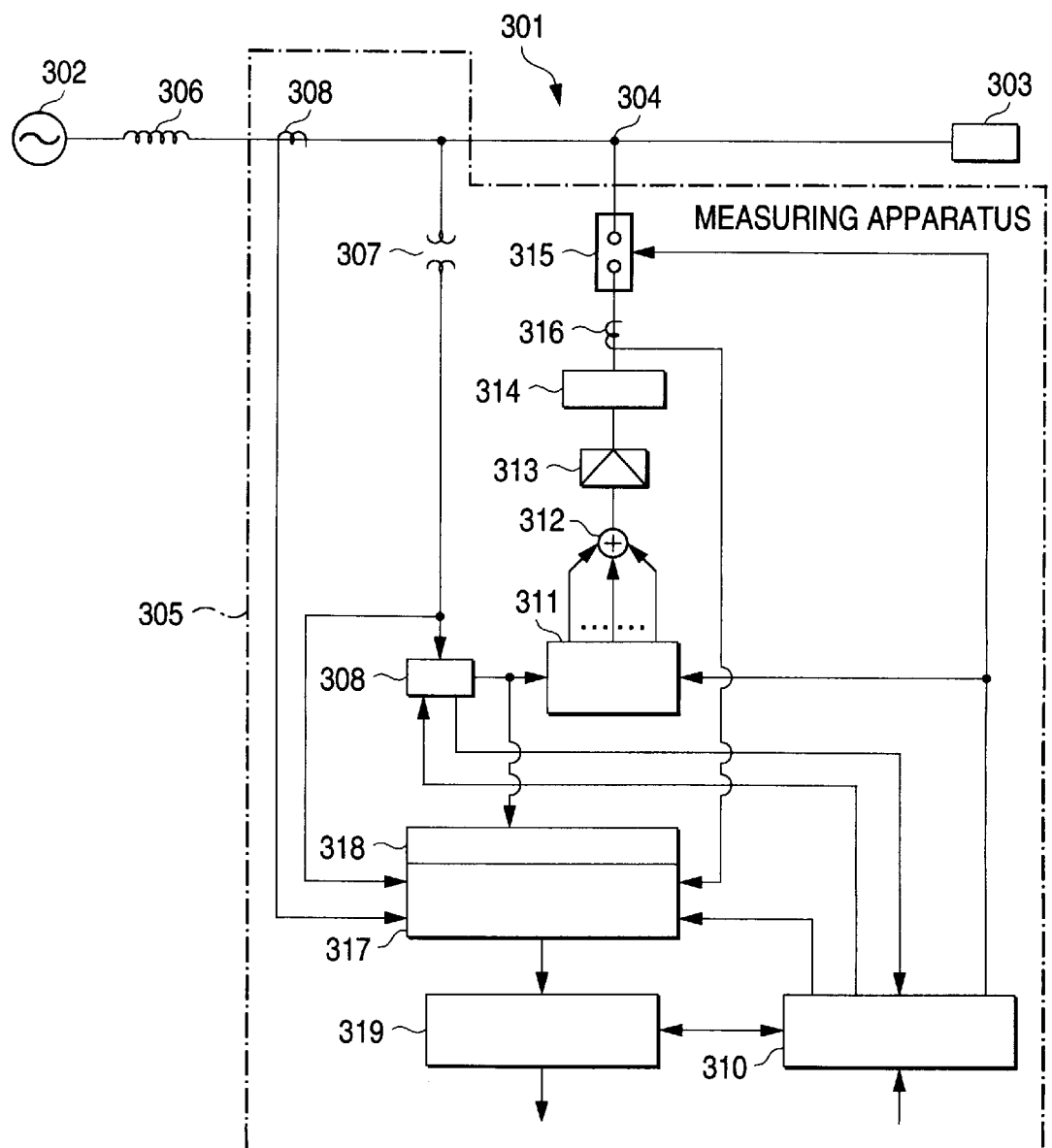
FIG. 13 is a circuit block diagram of a fourth embodiment of the invention.

A fourth embodiment of the invention will be discussed with reference to FIG. 13 to FIG. 17. The power system of FIG. 13 is similar to the power system of FIG. 1. However, the inject signals are added together by an adder 312 and supplied to an amplifier 313, which then amplifies to form currents of inter-harmonics synchronized with the fundamental wave above and below the measurement harmonic.

Further, the sampling data (measurement data) of the A/D conversion section 317 is supplied to a signal processing section 319, which then performs analog frequency analysis or digital frequency analysis of DFT processing, FFT processing, etc., adopts at least either the upstream or downstream side from the harmonic inject point 304 in the power system 301, for example, the downstream side as the attention side based on the analysis result, and finds the admittances for the inter-harmonics above and below the measurement harmonic on the attention side, then performs interpolation processing based on the admittances above and below the measurement harmonic, thereby finding the admittance for the measurement harmonic.

By the way, it is possible in the simplest way that the frequencies of the inter-harmonics are set so that they are each properly preset mth degree (0<m<1) away from the measurement harmonic. However, if the frequencies are thus set not considering the state of the power system 301, a situation in which any intermediate-degree harmonic exists at a comparatively large level in the power system 301 occurs. In this case, the effect of the power system 301 is received and highly accurate measurement cannot be executed.

Then, in the embodiment, frequencies not existing in the power system 301 or extremely slight frequencies if present are previously selected and are set to the frequencies of the inter-harmonics.

Figure 14:
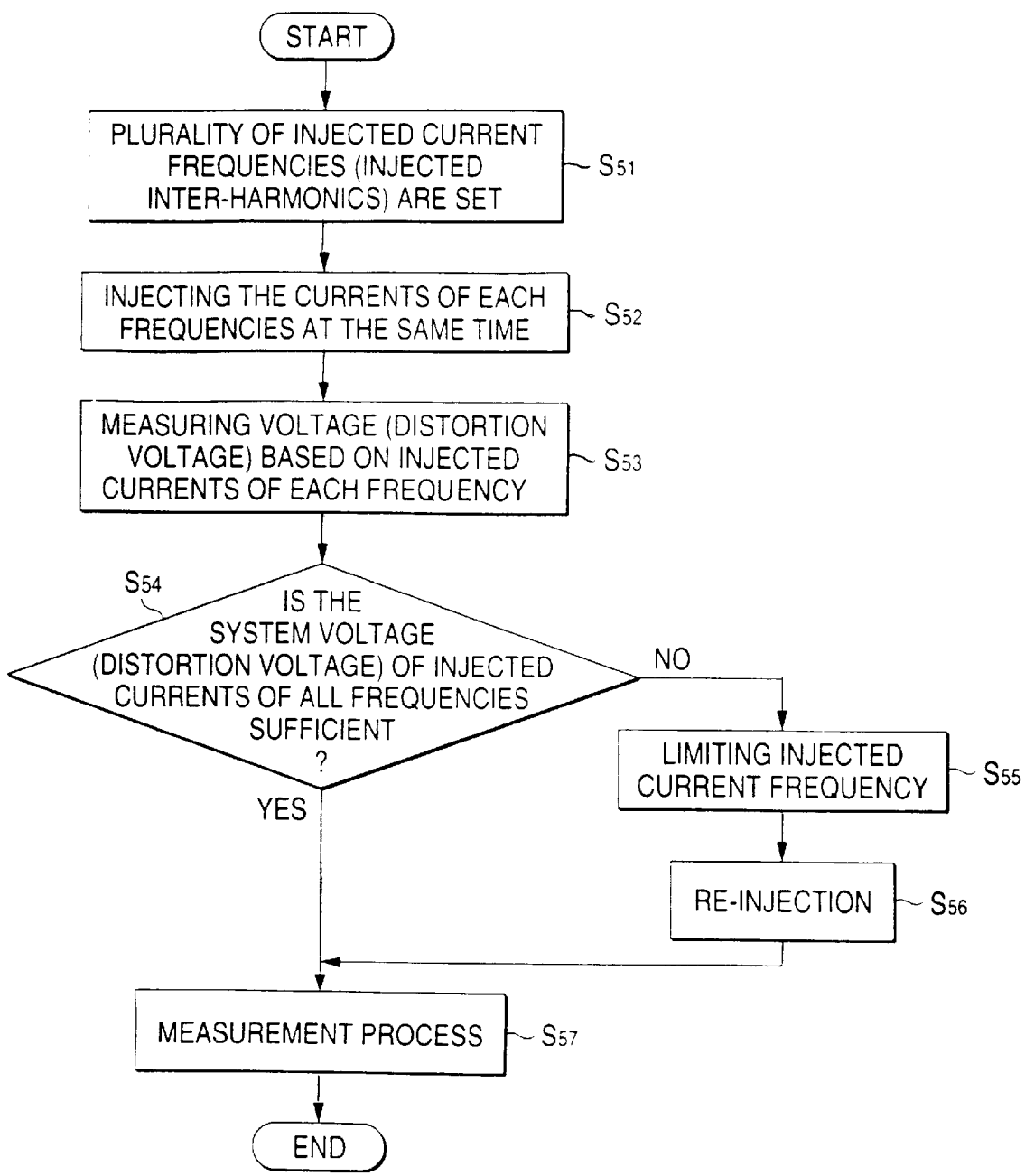
FIG. 14 is a first flowchart to describe the operation in FIG. 13.

That is, the control section 310 controls the measuring apparatus 305 in processing in FIG. 14.

Before the currents of the inter-harmonics are injected, injected inter-harmonics (injected current frequencies) above and below the measurement harmonic are set at step S51 in FIG. 14 from the actual measurement result.

Next, an injected current frequency setting technique will be discussed.

Figure 15:
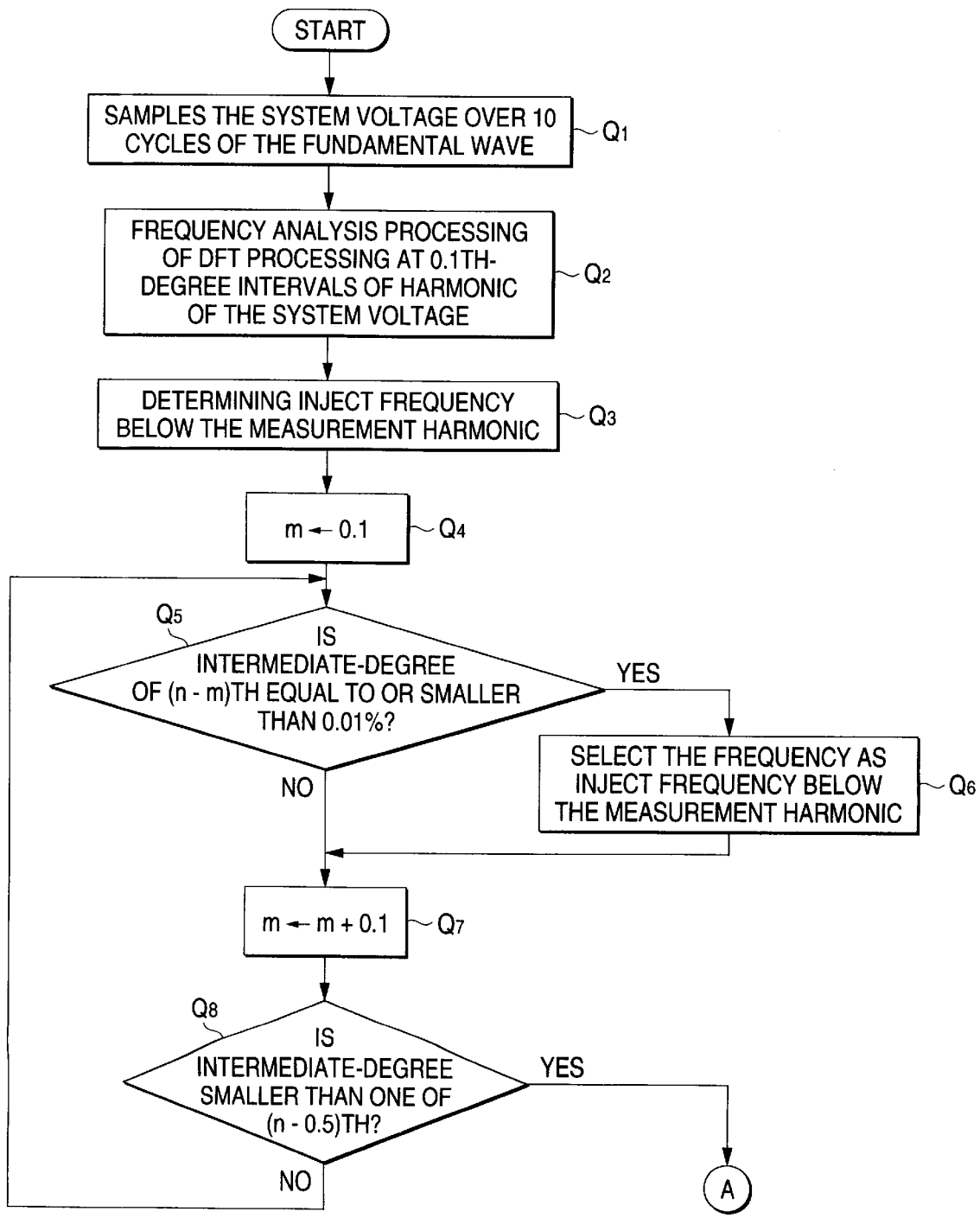
FIG. 15 is a second flowchart to describe the detailed operation of a part in FIG. 14.
Figure 16:
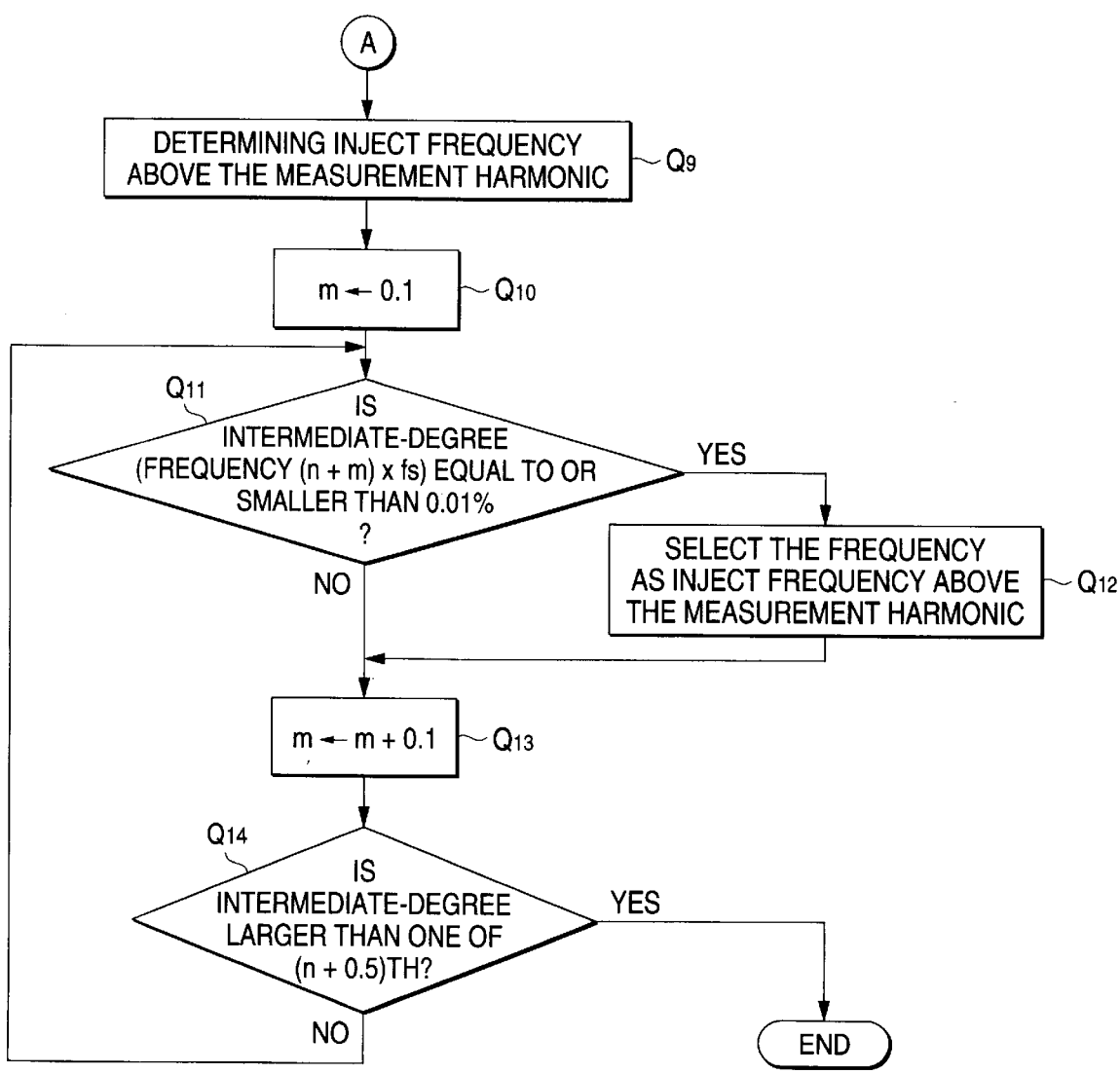
FIG. 16 is a third flowchart to describe the detailed operation of a part in FIG. 14.
Figure 17:
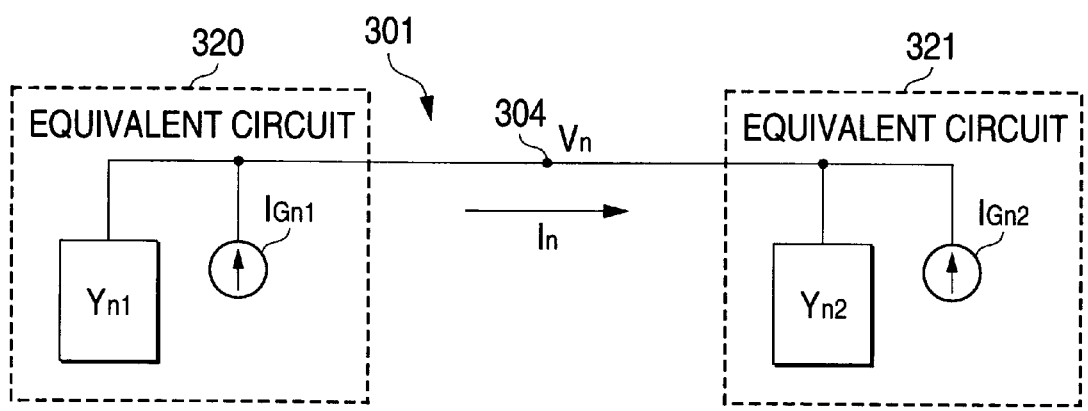
FIG. 17 is harmonic equivalent circuit diagrams in a power system in FIG. 13.

First, step S51 in FIG. 14 consists of steps Q1 to Q15 in FIG. 15 and FIG. 16. When step S51 is executed, the system voltage is sampled with the switch 315 open.

At this time, for example, if measurement accuracy is set to $1/10$ (=0.1), based on processing of the control section 310 at step Q1 in FIG. 15, the A/D conversion section 317 samples the detection signal of the transformer 307 and the system voltage over 10 cycles of the fundamental wave while shifting the sampling phase and forms system voltage measurement data.

The system voltage measurement data is supplied to the signal processing section 319, which then performs a frequency analysis based on control at step Q2 in FIG. 15, thereby carrying out a frequency analysis at 0.1th-degree intervals of harmonic of the system voltage.

Then, control goes to step Q3 in FIG. 15 for determining inject frequency below the measurement harmonic. At steps Q4–Q8 of the control section 310, the signal processing section 319 detects the magnitude (voltage) of (nm)th-degree intermediate-degree harmonic in 0.1th-degree steps, for example, between the system voltage measurement harmonic (nth-degree harmonic) and the (n−1)th-degree harmonic therebelow in order starting at the harmonic closest to the measurement harmonic and compares the detected magnitude (voltage) with a setup value.

At this time, to select frequencies of voltages not or little existing in the power system 301 as injected current frequencies, the setup value is set to, for example, 0.01% magnitude (voltage) of the fundamental wave considering a measurement error, etc.

The lower limit of the intermediate-degree harmonic whose magnitude (voltage) is to be detected is actually set to, for example, (n−0.5)th-degree (m=0.5).

The frequencies equal to or less than the setup value, of the (n−0.1)th-degree, (n−0.2)th-degree, . . . , (n−0.5)th-degree inter-harmonics are selected as the injected current frequencies below the measurement harmonic.

Although the intermediate-degree harmonic whose magnitude (voltage) is detected becomes (n−0.5)th-degree, if the intermediate-degree harmonic whose magnitude (voltage) is equal to or less than 0.01% of the fundamental wave is not detected, comparatively large voltage of intermediate-degree harmonic not originally existing in the power system 301 exists in the proximity of the measurement harmonic and precise measurement based on the injected current cannot be executed, thus the processing is forcibly terminated and the measurement is stopped.

On the other hand, upon completion of comparison and selection to the (n−0.5)th-degree, YES is returned at step Q8 in FIG. 15 and control goes to step Q9 in FIG. 16 for determining inject frequency above the measurement harmonic.

At steps Q10–Q15 of the control section 310, the signal processing section 319 detects the magnitude (voltage) of (n+m)th-degree intermediate-degree harmonic in 0.1th-degree steps between the system voltage measurement harmonic and the (n+1)th-degree harmonic thereabove in order starting at the harmonic closest to the measurement harmonic, compares the detected magnitude (voltage) with a setup value, detects inter-harmonics above the system voltage measurement harmonic, equal to or less than the setup value, and determines the frequency to be the injected current frequency above the measurement harmonic as with setting of the injected current frequencies below the measurement harmonic.

Upon completion of comparison and selection to the (n+0.5)th-degree, YES is returned at step Q15 in FIG. 16 and step S1 in FIG. 14 is terminated.

When the injected current frequencies above and below the measurement harmonic are selected and set at step S51, the setup result is sent from the signal processing section 319 to the control section 310 and control goes to step S52 in FIG. 14.

At step S52, the control section 310 instructs the inject source signal generation section 311 to generate signals of the setup injected current frequencies above and below the measurement harmonic. In response to the instruction, the inject source signal generation section 311 generates signals of injecting the inter-harmonics not existing in the power system 301 or existing only 0.01% or less of the fundamental wave above and below the measurement harmonic.

Therefore, in the embodiment, the frequencies of the currents of the inter-harmonics above and below the measurement harmonic are set so as to minimize the effect of the power system 301 considering the state of the power system 301 and the currents are injected into the harmonic inject point 304 at the same time.

At this time, to execute measurement with desired accuracy (0.1) with continuity held between the sampling start and end without making high sampling frequency of the A/D conversion section 317, the current of each intermediate-degree harmonic is injected in 10 cycles (=1/0.1 cycles) of the fundamental wave, as described above.

By the way, the current amount of each intermediate-degree harmonic depends on the current output capability of the measuring apparatus 305 based on the magnitude of each inject signal, the amplification capability of the amplifier 312, etc., namely, power as the current source and the number of inter-harmonics; as the number of injected currents increases, the current amount per injected current decreases.

Therefore, particularly when the measuring apparatus 305 is a small apparatus with small power, if currents of all setup injected current frequencies are injected, a situation in which shortage of each injected current occurs and measurement cannot be executed also occurs depending on the state of the power system 301.

Then, in the embodiment, when an insufficient amount of current is injected, the number of injected currents is limited for solving shortage of the injected current amount as follows:

When the currents of the inter-harmonics set at step S51 in FIG. 14 are injected into the power system 301 at the same time at step S52, voltage (distortion voltage) based on each injected current in the power system 301 is measured at step S53.

To measure the distortion voltage, when the currents of the inter-harmonics above and below the measurement harmonic are injected into the harmonic inject point 304 at the same time, the signal processing section 319 carries out a frequency analysis on the system voltage measurement data of the A/D conversion section 317 based on the detection signal of the transformer 307.

At step S54, the signal processing section 319 determines whether or not the voltage based on each injected current becomes equal to or greater than a threshold value above and below the measurement harmonic and if one of the voltages becomes smaller than the threshold value and injected current shortage is detected, the signal processing section 319 instructs the control section 310 to again inject current.

If the instruction occurs as each intermediate-degree harmonic above or below the measurement harmonic is injected, control goes from step S54 to step S55 at which the control section 310 selects one or more from the inter-harmonics above or below the measurement harmonic set at step S51 for limiting the number of injected currents.

To limit the number of injected currents, only a preset number of currents are selected in order starting at the current closest to the measurement harmonic, for example.

As the number of injected currents is decreased, the current amount per injected current increases and if the number of injected currents is narrowed down to one, the current amount becomes the maximum output current amount of the measuring apparatus 305. Thus, in the description, the number of injected currents is assumed to become one after it is limited.

Control goes to step S56 at which a control signal of the limited injected current frequency is supplied from the control section 310 to the inject source signal generation section 311 and predetermined intermediate-degree harmonic current after the number of injected currents is limited is injected into the harmonic inject point 304.

At this time, the injected current amount becomes the maximum output current of the measuring apparatus 305, reliably solving the injected current shortage.

If sufficient system voltage (distortion voltage) is provided in the first injecting or again injecting, the signal processing section 319 performs a measurement process at step S57 for finding the admittance for the measurement harmonic on the attention side.

The admittance and equivalent circuit for the measurement harmonic are found in the same manner as in the first embodiment.

When the current Ix of each intermediate-degree harmonic is a current of a frequency not or little existing in the power system 301 and moreover shortage of the injected current amount occurs, the number of currents Ix is limited and the injected current amount is increased. Thus, if the measuring apparatus 305 is a small apparatus with a small power capacity, each admittance Yx2 is found precisely without receiving the harmonic effect in the power system 301.

The admittances Yx2(u) and Yx2(d) are found from the measurement result based on intermediate-degree harmonic currents simultaneously injected and measured, thus an error based on a injecting time (measurement time) lag between the admittances Yx2(u) and between the admittances Yx2(d) and the admittances Yx2(u) and Yx2(d) are calculated precisely without receiving the harmonic effect in the power system 101 or an error involved in the measurement time lag; the admittance Yn for the measurement harmonic is found precisely.

(Another Form of Fourth Embodiment)

Next, a form will be discussed wherein a harmonic equivalent circuit in the power system 301 is a series circuit of an impedance and a voltage source and the impedance for the measurement harmonic on the upper stream or downstream side or an equivalent circuit of series connection of the impedance and voltage source is found.

In this form, applied voltage frequencies (intermediate-degree harmonic frequencies) between the measurement harmonic (nth-degree harmonic) and the (n±1)th-degree harmonics are found and determined according to a technique similar to that shown in FIG. 15 and FIG. 16 by performing processing similar to that at step S51 in FIG. 14.

Further, voltages of the determined intermediate-degree harmonic frequencies each above and below the measurement harmonic are simultaneously applied to the harmonic inject point 304 in 10 cycles of the fundamental wave, for example, by performing processing similar to that at step S52 in FIG. 14 and whether or not the system current (distortion current) for the applied voltage of each intermediate-degree harmonic on the attention side is sufficient is determined from a frequency analysis based on the detection signals of the transformer 307 and the current transformers 308 and 316 by performing processing similar to that at steps S53 and S54 in FIG. 14.

If the system current (distortion current) is insufficient, the applied frequency is limited and the voltage of each intermediate-degree harmonic above and below the measurement harmonic is again applied to the harmonic inject point 304 by performing processing similar to that at steps S55 and S56 in FIG. 14.

Further, the A/D conversion section 317 converts the detection signals of the transformer 307 and the current transformers 308 and 316 into measurement data based on voltage application of each intermediate-degree harmonic and the signal processing section 319 finds the impedance for the measurement harmonic on the attention side based on the measurement data according to a processing technique similar to that at step S57 in FIG. 14.

The impedance and equivalent circuit for the measurement harmonic is found in the same manner as in the first embodiment.

In the fourth embodiment and another form of the fourth embodiment, the currents or voltages of inter-harmonics not originally existing in the power system 301 each above and below the measurement harmonic are simultaneously injected into (applied to) the power system 301 each above and below the measurement harmonic and the voltages, currents in the power system 301 are measured, then an admittance (impedance) or equivalent circuit for the measurement harmonic is found. Thus, based on current injecting (voltage applying) in a short time (at the same time), the effect of the power system 301 is not received and moreover an error caused by an injecting (applying) time lag is prevented; the admittance (impedance) or equivalent circuit for the measurement harmonic on the attention side in the power system 301 can be found with accuracy.

Before measurement, only inter-harmonics above and below the measurement harmonic in the power system 301 not actually existing or extremely slight if present are selected as injected (applied) frequencies and at the measurement time, the currents or voltages of the inter-harmonics of the frequencies are injected or applied, thus the admittance (impedance) or equivalent circuit can be found more accurately.

Further, if the measuring apparatus 305 is small as compared with the component of each injected current (applied voltage) existing in the power system 301 and each injected current (applied voltage) cannot be made sufficiently large, the number of injected currents (applied voltages) each above and below the measurement harmonic is limited to one, for example, and sufficiently large current or voltage of intermediate-degree harmonic is again injected or applied for measurement. Thus, the small measuring apparatus 305 would be able to accurately find the admittance (impedance) or equivalent circuit for the measurement harmonic on the attention side in the power system 301 in various conditions.

By the way, the frequency intervals of the injected currents (applied voltages) of the inter-harmonics, the number of selected injected currents (applied voltages), the current injecting (voltage applying) period, etc., may be set properly in response to the measurement state, etc.; they are not limited to the values mentioned here.

A plurality of injected currents (applied voltages) may be formed by digital frequency synthesizing, etc., based on software processing of a microcomputer, for example.

[Advantages of the Invention]

The invention provides the following advantages:

In the invention as claimed in claim 7, the currents of the frequencies of non-integral multiples of the fundamental wave above and below the measurement harmonic are simultaneously supplied to the power system 301 and are measured. Thus, each current can be injected and measured in a short time independently of the number of injected currents and moreover a measurement error involved in injecting and measurement time lag between the currents is prevented; the currents of the frequencies of non-integral multiples of the fundamental wave are injected into the power system 301 and the admittance for the measurement harmonic on the attention side in the power system 301 or equivalent circuit can be found rapidly with accuracy.

In the invention as claimed in claim 8, the intermediate-degree harmonic currents injected into the power system 301 above and below the measurement harmonic are set to only frequencies equal to or less the setup value existing in the power system. Thus, highly accurate measurement can be accomplished by injecting a small amount of current; the measuring apparatus 305 can be miniaturized and the admittance for the measurement harmonic on the attention side in the power system 301 or equivalent circuit can be found more accurately.

In the invention as claimed in claim 9, when the amount of each intermediate-degree harmonic current first injected is insufficient, the number of injected currents is limited and the injected current amounts of inter-harmonics above and below the measurement harmonic can be increased for measurement. A small apparatus with a small power capacity can be used to accurately find the admittance for the measurement harmonic on the attention side in the power system 301 in various conditions or equivalent circuit.

In the invention as claimed in claim 10, instead of injecting currents, intermediate-degree harmonic voltages can be applied for finding impedance for the measurement harmonic on the attention side in the power system 301 or an equivalent circuit. At the time, an advantage similar to that in claim 7, 8, or 9 can be provided.

What is claimed is:

1. A harmonic component measuring method for a power system, for finding an admittance for a measurement harmonic or an equivalent circuit comprising the admittance and a current source in parallel, wherein an mth-degree harmonic of a frequency which is m times (m is an integer) a frequency fs of a fundamental wave in the power system is used as the measurement harmonic, said harmonic component measuring method comprising the steps of:

synchronizing currents of inter-harmonics with the measurement harmonic, wherein the currents of inter-harmonics comprises currents of frequencies fx which are non-integral multiples of the fundamental wave above and below the measurement harmonic;

finding and determining the frequencies fx of the currents of inter-harmonics between the mth-degree measurement harmonic and (m±1)th-degree harmonics from an expression of fx=(fs*m)±{(fs/n)*k)} where n is an integer of 1, 2, . . . , n responsive to measurement accuracy 1/n (0<1/n<1) and k is an integer of 1, 2, . . . , n for frequency setting;

injecting the currents of inter-harmonics into a harmonic inject point in the power system in n cycles of the fundamental wave;

measuring voltages at the harmonic inject point based on the injected currents of inter-harmonics and measuring currents at least either upstream or downstream from the harmonic inject point in the power system;

calculating admittances for the injected currents of inter-harmonics on at least either an upstream or a downstream side from the harmonic inject point from the measurement results; and performing interpolation processing based on the calculation results to find the admittance for the measurement harmonic on at least either the upstream or the downstream side from the harmonic inject point.

2. A harmonic component measuring method for a power system, for finding an impedance for a measurement harmonic or an equivalent circuit comprising the impedance and a current source in series, wherein an mth-degree harmonic of a frequency which is m times (m is an integer) a frequency fs of a fundamental wave in the power system is used as the measurement harmonic, said harmonic component measuring method comprising the steps of:

synchronizing voltages of inter-harmonics with the measurement harmonic, wherein the voltages of inter-harmonics comprises voltages of frequencies fx which are non-integral multipies of the fundamental wave above and below the measurement harmonic;

finding and determining the frequencies fx of the voltages of inter-harmonics between the mth-degree measurement harmonic and (m±1)th-degree harmonics from an expression of fx=(fs*m)±{(fs/n)*k)} where n is an integer of 1, 2, . . . , n responsive to measurement accuracy 1/n (0<1/n<1) and k is an integer of 1, 2, . . . , n for frequency setting;

applying the voltages of inter-harmonics to a harmonic inject point in the power system in n cycles of the fundamental wave;

measuring voltages at the harmonic inject point based on the applied voltages of inter-harmonics and measuring currents at least either upstream or downstream from the harmonic inject point in the power system;

calculating impedances for the applied voltages of inter-harmonics on at least either an upstream or a downstream side from the harmonic inject point from the measurement results; and performing interpolation processing based on the calculation results to find the impedance for the measurement harmonic on at least either the upstream or the downstream side from the harmonic inject point.

3. A harmonic component measuring method for a power system, for finding an admittance for a measurement harmonic or an equivalent circuit comprising the admittance and a current source in parellel wherein an nth-degree harmonic of a frequency which is n times (n is an integer) a frequency fs of a fundamental wave in the power system is used as the measurement harmonic, said harmonic component measuring method comprising the steps of:

performing a frequency analysis of system voltage data at a harmonic inject point in the power system and detecting (n±m)th-degree (0<m<1) intermediate-degree harmonic components in an order starting at the component closest to the measurement harmonic, wherein the (n±m) th-deqree intermediate-degree harmonic components are components of frequencies of non-integral multiples of the fundamental wave, synchronized therewith, above and below the measurement harmonic of the system voltage;

determining inject frequencies above and below the measurement harmonic at a measurement time, wherein the inject frequencies above and below the measurement harmonic comprises first detected frequencies of the intermediate-degree harmonic components above and below the measurement harmonic at which the harmonic components are equal to or less than a setup value;

injecting currents of the inject frequencies into the harmonic inject point at the measurement time;

measuring voltages at the harmonic inject point based on the injected currents of the inject frequencies and measuring currents at least either upstream or downstream from the harmonic inject point in the power system;

calculating admittances for the injected currents of the inject frequencies on at least either an upstream or a downstream side from the harmonic inject point from the measurement results; and performing interpolation processing based on the calculation results to find the admittance for the measurement harmonic on at least either the upstream or the downstream side from the harmonic inject point.

4. A harmonic component measuring method for a power system, for finding an impedance for a measurement harmonic or an equivalent circuit comprising the impedance and a current source in series, wherein an nth-degree harmonic of a frequency which is n times (n is an integer) a frequency fs of a fundamental wave in the power system is used as the measurement harmonic, said harmonic component measuring method comprising the steps of:

perfoming a frequency analysis of system voltage data at a harmonic inject point in the power system and detecting (n±m)th-degree (0<m<1) intermediate-degree harmonic components in an order starting at the component closest to the measurement harmonic, wherein the (n±m) th-degree intermediate-degree harmonic components are components of frequencies of non-integral multiples of the fundamental wave, synchronized therewith, above and below the measurement harmonic of the system voltage;

determining apply frequencies above and below the measurement harmonic at a measurement time, wherein the apply frequencies above and below the measurement harmonic comprises first detected frequencies of the intermediate-degree harmonic components above and below the measurement harmonic at which the harmonic components are equal to or less than a setup value;

applying voltages of the apply frequencies to the harmonic inject point at the measurement time;

measuring voltages at the harmonic inject point based on the applied voltages of the apply frequencies and measuring currents at least either upstream or downstream from the harmonic inject point in the power system;

calculating impedances for the applied voltages of the apply frequencies on at least either an upstream or a downstream side from the harmonic inject point from the measurement results; and performing interpolation processing based on the calculation results to find the impedance for the measurement harmonic on at least either an upstream or the downstream side from the harmonic inject point.

5. A harmonic component measuring method for a power system comprising the steps of:

injecting currents of frequencies of non-integral multiples of a fundamental wave above and below a measurement harmonic into a harmonic inject point in the power system while gradually increasing the currents until a distortion voltage measured at the harmonic inject point rises to almost a predetermined upper limit voltage, wherein the measurement harmonic is a harmonic of a frequency of an integral multiple of the fundamental wave;

calculating admittances for the injected currents on at least either an upstream or a downstream side from the harmonic inject point in the power system from voltage measurement results at the harmonic inject point based on the injected currents and current measurement results on at least either the upstream or the downstream side from the harmonic inject point in the power system; and performing interpolation processing based on the calculation results to find an admittance for the measurement harmonic on at least either the upstream or the downstream side from the harmonic inject point.

6. A harmonic component measuring method for a power system comprising the steps of:

injecting currents of frequencies of non-integral multiples of a fundamental wave above and below a measurement harmonic into a harmonic inject point in the power system while gradually increasing the currents until a distortion voltage measured at the harmonic inject point rises to almost a predetermined upper limit voltage, wherein the measurement harmonic is a harmonic of a frequency of an integral multiple of the fundamental wave;

calculating admittances for the injected currents on at least either an upstream or a downstream side from the harmonic inject point in the power system from voltage measurement results at the harmonic inject point based on the injected currents and current measurement results on at least either the upstream or the downstream side from the harmonic inject point in the power system;

performing interpolation processing based on the calculation results to find an admittance of an equivalent circuit for the measurement harmonic on at least either the upstream or the downstream side from the harmonic inject point;

finding and determining a current source of the equivalent circuit for the measurement harmonic on at least either the upstream or the downstream side from the harmonic inject point from the admittance determined for the measurement harmonic and a measurement harmonic voltage and current measurement results in the power system at the harmonic inject point; and finding the equivalent circuit for the measurement harmonic on at least either the upstream or the downstream side from the harmonic inject point from a parallel circuit of the determined admittance and the determined current source.

7. A harmonic component measuring method for a power system, for finding an admittance for a measurement harmonic or an equivalent circuit comprising the admittance and a current source in parallel, wherein an nth-degree harmonic of a frequency which is n times (n is an integer) a frequency fs of a fundamental wave in a power system is used as the measurement harmonic, said harmonic component measuring method comprising the steps of:

simultaneously injecting currents of frequencies of non-integral multiples of the fundamental wave above and below the measurement harmonic into a harmonic inject point in the power system;

measuring voltages at the harmonic inject point based on the injected currents and measuring currents at least either upstream or downstream from the harmonic inject point in the power system;

calculating admittances for the injected currents on at least either an upstream or a downstream side from the harmonic inject point in the power system from the measurement results; and performing interpolation processing based on the calculation results to find the admittance for the measurement harmonic on at least either the upstream or the downstream side from the harmonic inject point.

8. The harmonic component measuring method as claimed in claim 7 comprising the steps of:

performing a frequency analysis of a measurement voltage at the harmonic inject point before injecting currents into the harmonic inject point;

retrieving frequencies of the measurement voltage components at which the voltage components are equal to or less than a setup value above and below the measurement harmonic in the power system; and injecting currents of the retrieval frequencies into the harmonic inject point.

9. The harmonic component measuring method as claimed in claim 7 or 8 comprising the steps of:

limiting the number of injected currents when the measured voltage at the harmonic inject point based on the injected currents becomes equal to or less than a reference value, and again injecting one or more currents of the frequencies of non-integral multiples of the fundamental wave above and below the measurement harmonic into the harmonic inject point;

calculating admittances for the injected currents from the voltage measurement results at the harmonic inject point and the current measurement results on at least either the upstream or the downstream side from the harmonic inject point; and finding the admittance for the measurement harmonic on at least either the upstream or the downstream side from the harmonic inject point.

10. The harmonic component measuring method as claimed in claim 7 or 8 comprising the steps of:

applying voltages of the frequencies of non-integral multiples of the fundamental wave into the harmonic inject point in place of the currents of the frequencies of non-integral multiples of the fundamental wave;

calculating impedances based on the voltage measurement results and the current measurement results; and performing interpolation processing based on the calculation results to find the impedance for the measurement harmonic on at least either an upstream or downstream side from the harmonic inject point.

11. A harmonic component measuring method for a power system comprising the steps of:

injecting currents of frequencies of non-integral multiples of a fundamental wave above and below a measurement harmonic into a harmonic inject point in the power system wherein the measurement harmonic is a harmonic of a frequency of an integral multiple of the fundamental wave;

measuring voltages at the harmonic inject point based on the injected currents and currents at least either upstream or downstream from the harmonic inject point in the power system;

determining equivalent circuits on an upstream and a downstream side from the harmonic inject point wherein each equivalent circuit comprises a parallel circuit of an admittance and a current source;

calculating admittances for the injected currents on at least either the upstream or the downstream side from the harmonic inject point from the measurement results; and performing interpolation processing based on the calculation results to find an admittance for the measurement harmonic on at least either the upstream or the downstream side from the harmonic inject point.

12. A harmonic component measuring method for a power system comprising the steps of:

injecting currents of frequencies of non-integral multiples of a fundamental wave above and below a measurement harmonic into a harmonic inject point in the power system wherein the measurement harmonic is a harmonic of a frequency of an integral multiple of the fundamental wave;

measuring voltages at the harmonic inject point based on the injected currents and currents at least either upstream or downstream from the harmonic inject point in the power system;

determining equivalent circuits on an upstream and a downstream side from the harmonic inject point wherein each equivalent circuit comprises a parallel circuit of an admittance and a current source;

calculating admittances for the injected currents on at least either the upstream or the downstream side from the harmonic inject point from the measurement results;

performing interpolation processing based on the calculation results to find an admittance for the measurement harmonic on at least either the upstream or the downstream side from the harmonic inject point;

finding and determining a current source for the measurement harmonic on at least either the upstream or the downstream side from the harmonic inject point from the admittance determined for the measurement harmonic and a measurement harmonic voltage and current measurement results in the power system at the harmonic inject point; and finding the equivalent circuit for the measurement harmonic on at least either the upstream or the downstream side from the harmonic inject point.

13. A harmonic component measuring method for a power system comprising the steps of:

applying voltages of frequencies of non-integral multiples of a fundamental wave above and below a measurement harmonic into a harmonic inject point in the power system wherein the measurement harmonic is a harmonic of a frequency of an integral multiple of the fundamental wave; measuring voltages at the harmonic inject point based on the applied voltages and currents at least either upstream or downstream from the harmonic inject point in the power system;

determining equivalent circuits on an upstream and a downstream side from the harmonic inject point wherein each equivalent circuit comprises a series circuit of an impedance and a voltage source;

calculating impedances for the applied voltages on at least either the upstream or the downstream side from the harmonic inject point from the measurement results; and performing interpolation processing based on the calculation results to find an impedance for the measurement harmonic on at least either the upstream or the downstream side from the harmonic inject point.

14. A harmonic component measuring method for a power system comprising the steps of:

applying voltages of frequencies of non-integral multiples of the fundamental wave above and below a measurement harmonic into a harmonic inject point in the power system wherein the measurement harmonic is a harmonic of a frequency of an integral multiple of the fundamental wave;

measuring voltages at the harmonic inject point based on applied voltages and currents at least either upstream or downstream from the harmonic inject point in the power system;

determining equivalent circuits on an upstream and a downstream side from the harmonic inject point wherein each equivalent circuit comprises a series circuit of an impedance and a voltage source;

calculating impedances for the applied voltages on at least either the upstream or the downstream side from the harmonic inject point from the measurement results;

performing interpolation processing based on the calculation results to find an impedance for the measurement harmonic on at least either the upstream or downstream side from the harmonic inject point;

finding and determining a voltage source for the measurement harmonic on at least either the upstream or the downstream side from the harmonic inject point from the impedance determined for the measurement harmonic and a measurement harmonic voltage and current measurement results in the power system at the harmonic inject point; and finding the equivalent circuit for the measurement harmonic on at least either the upstream or the downstream side from the harmonic inject point.

15. The harmonic component measuring method as claimed in claim 7 or 8 comprising the steps of:

applying voltages of the frequencies of non-integral multiples of the fundamental wave into the harmonic inject point in place of the currents of the frequencies of non-integral multiples of the fundamental wave;

limiting the number of applied voltages when the measured voltage at the harmonic inject point based on the injected currents becomes equal to or less than a reference value, and again injecting one or more voltages of the frequencies of non-integral multiples of the fundamental wave above and below the measurement harmonic into the harmonic inject point;

calculating impedances based on the voltage measurement results and the current measurement results; and performing interpolation processing based on the calculation results to find the impedance for the measurement harmonic on at least either an upstream or downstream side from the harmonic inject point.

* * * * *